United States Patent

Kumagai et al.

[11] Patent Number: 6,018,256
[45] Date of Patent: Jan. 25, 2000

[54] OUTPUT CIRCUIT AND ELECTRONIC APPARATUS USING THE SAME

[75] Inventors: Takashi Kumagai; Yasunobu Tokuda, both of Nagano, Japan

[73] Assignee: Seiko Epson Corporation, Tokyo, Japan

[21] Appl. No.: 08/809,895

[22] PCT Filed: Jul. 4, 1996

[86] PCT No.: PCT/JP96/01851

§ 371 Date: Mar. 7, 1997

§ 102(e) Date: Mar. 7, 1997

[87] PCT Pub. No.: WO97/03498

PCT Pub. Date: Jan. 30, 1997

[30] Foreign Application Priority Data

Jul. 7, 1995 [JP] Japan .................................. 7-172626

[51] Int. Cl.$^7$ .............................. H03K 3/00; H03B 1/00
[52] U.S. Cl. .......................................... 327/112; 327/374
[58] Field of Search .................................. 327/108, 109, 327/112, 365, 374–377, 379, 389, 427, 434, 437; 326/17, 20, 82, 83, 85, 87, 91

[56] References Cited

U.S. PATENT DOCUMENTS

| 4,983,860 | 1/1991 | Yim et al. | 326/17 |
| 5,546,029 | 8/1996 | Koke | 327/108 |

FOREIGN PATENT DOCUMENTS

| 384673 | 8/1990 | European Pat. Off. . |
| 62-159910 | 7/1987 | Japan . |
| 63-112893 | 5/1988 | Japan . |
| 63-117839 | 5/1988 | Japan . |
| 1-149290 | 6/1989 | Japan . |
| 213120 | 1/1990 | Japan . |
| 2-113493 | 4/1990 | Japan . |
| 2220294 | 9/1990 | Japan . |
| 2235296 | 9/1990 | Japan . |
| 4281298 | 10/1992 | Japan . |
| 5189974 | 7/1993 | Japan . |
| 7135463 | 5/1995 | Japan . |
| 8-077775 | 3/1996 | Japan . |

*Primary Examiner*—My-Trang Nuton
*Attorney, Agent, or Firm*—Loeb & Loeb, LLP

[57] ABSTRACT

An output circuit which outputs a data signal from an output terminal after setting the output terminal to a potential intermediate between a power supply line potential and a ground line potential. The output circuit includes an output drive configured of first and second transistors. The first transistor has a first control terminal to which is input a first control signal. The second transistor has a second control terminal to which is input a second control signal. It further includes a setting member which controls the first and second control signals to set the first and second transistors to the off state. It further includes a shorting member which shorts one of the first and second control terminals and the output terminal. Moreover, before the data signal is output, the transistors are set to the off state by the setting member, after which shorting is carried out according to the potential of the output terminal, and the output terminal is set to an intermediate potential.

23 Claims, 27 Drawing Sheets

OUTPUT CIRCUIT AND ELECTRONIC APPARATUS USING THE SAME

TECHNICAL FIELD

The present invention relates to an output circuit for a semiconductor device, and in particular to an output circuit providing high-speed data output and low noise characteristics, and also relates to an electronic apparatus using the same.

BACKGROUND OF ART

In recent years, with the increasingly fine structure of semiconductor devices, there has been a trend for the power supply voltage driving the devices to be reduced. For this reason, the access time increases in proportion to the reduced power supply voltage, whereas for this kind of device an increase in speed together with the reduced voltage is desirable.

At the same time, as with semiconductor devices of a multi-bit construction, when there is an output circuit formed from transistors which have a large current drive ability (referred to hereinafter as "ability") with respect to an external circuit, then noise can be caused by the parasitic resistance or inductance on the power supply lines or ground lines, and this can lead to malfunctions such as the erroneous writing of data or stray oscillation.

As a means of solving these problems is known a circuit which preceding the data output sets the output lines to an intermediate potential, or the so-called intermediate potential setting circuit (referred to hereinafter as "presetting circuit"). As examples of this type of circuit may be cited, for example, Japanese Patent Application Laid-Open No. 63-112893, Japanese Patent Application Laid-Open No. 63-117839, Japanese Patent Application Laid-Open No. 8-77775 (referred to hereinafter as "the first type"), and Japanese Patent Application Laid-Open No. 2-113493, Japanese Patent Application Laid-Open No. 1-149290 (referred to hereinafter as "the second type").

In particular the structure of the first type as disclosed in Japanese Patent Application Laid-Open No. 63-112893 (referred to hereinafter as "prior art 1") is shown in FIG. 23A, an equivalent circuit for preset operation is shown in FIG. 23B, and operating waveforms thereof are shown in FIGS. 24A and 24B. It should be noted that FIG. 24A shows the case where the output capacitance $C_L$ is a low load capacitance, at approximately 30 pF, and FIG. 24B shows the case where the output capacitance $C_L$ is a high load capacitance, at 100 pF or more.

In this device, by means of a presetting circuit 200 an output terminal $D_{out}$ is set to an intermediate potential determined by the ability ratio of Nch transistor Q2$a$ and Pch transistor Q1$a$. For example, if output terminal $D_{out}$ is initially high, the Pch transistor Q1$a$ conducts, and the drain voltage DN rises, and consequently the potential of the output terminal $D_{out}$ falls as a result of the current $I_{on2}$ and the current $I_{on}$, thus being preset.

However, there are the following problems with a device of the above type.

(1) During the presetting, Pch transistors Q1$a$ and Q6$a$, and Nch transistors Q2$a$ and Q12$a$ are all switched on, so that through currents $I_{op2}$ and $I_{on2}$ are generated, and the power consumption is increased. In particular this is a problem with a high voltage power supply.

(2) Again, with regard to $I_{on2}$, in a multi-bit output configuration, during presetting the amount of current flowing in the internal circuits increases substantially, and this leads to problems such as the generation of noise and faulty operation in peripheral circuits.

In more detail, during the presetting, as shown in FIGS. 24A and FIG. 24B, the current $I_{on2}$ becomes larger than the current $I_{on}$. Here the current $I_{on2}$ flows when the output terminal $D_{out}$ is at a potential above the threshold voltage of the Pch transistor Q1$a$ including a voltage due to the substrate bias effect. The current $I_{on}$ flows when the output terminal $D_{out}$ is at a potential above the sum of the threshold voltage of the Nch transistor Q4$a$ and the threshold voltage of the Pch transistor Q1$a$ including a voltage due to the substrate bias effect.

Moreover, in a semiconductor device with a large output buffer, to prevent output noise from causing erroneous operation in the internal circuit, as shown in FIG. 23B, the method is adopted whereby $V_{DD1}$ and GND1 are respectively connected to dedicated power supply pads for output drivers, and $V_{DD2}$ and GND2 are respectively connected to power supply pads for internal circuits. Using this method, a relatively large current $I_{on2}$ flows into the internal circuit.

It should be noted that the substrate bias effect refers to the effect that in an Nch transistor the source potential rises above the ground potential, and in a Pch transistor the source potential falls below the power supply potential, whereby the substrate is reverse biased, the threshold increases, and the channel resistance increases.

(3) When there is a large capacitance load, with the output capacitance $C_L$ being 100 pF or more, then in the interval $t_{ACC}$ shown in FIG. 24B, the change in the potential of the output terminal $D_{out}$ becomes slow, and presetting is not achieved.

The principal cause of this is that when for example the output terminal $D_{out}$ is high, with the fall in the potential of the output terminal $D_{out}$, the Pch transistor Q1$a$ experiences a substrate bias effect, and a sharp drop in power, so that the drain voltage DN of Q1$a$, which is determined by the ability ratio with respect to the Nch transistor Q2$a$ also falls, as a result of which sufficient power is not obtained for the Nch transistor Q4$a$.

Again, if output terminal $D_{out}$ is initially low, the cause is that Pch transistor Q3$a$ is restricted by the sum of the threshold voltage of Q3$a$ and the threshold voltage of the Nch transistor Q2$a$ including a voltage due to the substrate bias effect.

(4) With a low power supply voltage of 3V or less, there is insufficient operating margin for a presetting circuit, and short access times cannot be achieved with a low power supply voltage.

The principal reason for this is that in order to set the potential of the output terminal $D_{out}$ to an intermediate level determined by the ability ratio of the Nch transistor Q2$a$ and the Pch transistor Q1$a$ requires a power supply voltage of at least the sum of the threshold voltages of the transistors Q1$a$ and Q2$a$ each of which includes a voltage due to the substrate bias effect, and if the threshold voltages of Q1$a$ and Q2$a$ are set to be 0.7 V, the threshold voltages will each be raised to approximately 1.5 V, and their sum will be 3 V.

On the other hand, there is also the second type described above which has a presetting circuit configuration in which no through current flows through the pair of transistors forming the output driver. In particular the configuration of Japanese Patent Application Laid-Open No. 2-113493 (referred to hereinafter as "prior art 2") is shown in FIG. 25, and operating waveforms thereof are shown in FIGS. 26A and 26B. It should be noted that FIG. 26A shows the case where the output capacitance $C_L$ is a high load capacitance, at 100 pF or more, and FIG. 26B shows the case where the output capacitance $C_L$ is a low load capacitance, at approximately 30 pF.

In the device of FIG. 25 an output potential detection circuit 203 detects the potential level of the output terminal $D_{out}$, and one of two transistors 211 and 212 which are of opposite polarity with respect to each other is operated, to set the potential level of the output terminal $D_{out}$ to the intermediate potential.

However, with this device, particularly when the load capacitance connected to the output terminal is a small load capacitance, such as for example 30 pF, the following problems arise.

(5) In order to operate one of the transistors 211 and 212, according to the potential of the output terminal $D_{out}$, it is necessary to determine whether the potential of the output terminal $D_{out}$ is high or low, and thus it is necessary to detect the potential at the previously provided output potential detection circuit 203.

For example, if output terminal $D_{out}$ is high, then in the output potential detection circuit 203, the output of NAND gate 205 goes low, the output DN of NAND gate 207 in the output driver circuit 206 goes high, and Nch transistor 212 is switched on.

When the output capacitance $C_L$ is low, the time required for this detection is longer than the time for the potential of the output terminal to fall, when, if the output terminal $D_{out}$ is high, a current flows from the output capacitance $C_L$ into the Nch transistor 212. For this reason, before the NAND gate 205 of the output potential detection circuit 203 determines the output terminal $D_{out}$ to be low, the Nch transistor 212 causes the potential of the output terminal $D_{out}$ to fall at high speed, and the potential level of the output terminal $D_{out}$ cannot be determined definitively.

The reason that the output driver operates faster than this output potential decision is that generally in transistor drain current-drain voltage characteristics, if the gate potential is at least a threshold value, even in the region where the drain voltage is low, the current is large, and also since the load capacitance is low, this causes the time constant $\tau=RC=(V/I)C$ to be small.

As a result, before the output potential detection circuit 203 has determined the output terminal $D_{out}$ to be to be low, and switched the transistor 212 off, the output terminal $D_{out}$ has fallen to 0 V. Thereafter, the NOR gate 204 determines the output terminal $D_{out}$ to be low, and since DP goes low the Pch transistor 211 switches on. Then the output terminal $D_{out}$ rises at high speed, and as shown in FIG. 26B, during the preset interval the output terminal $D_{out}$ oscillates between the power supply potential and ground potential.

Thus, in the case of a small load capacitance, the speed with which the output driver raises or lowers the output terminal $D_{out}$ is higher. For this reason, during the preset interval the output oscillates, and in an output driver switching on and off at high speed, noise is generated by the current, and there are the additional problems of erroneous operation and unneeded current consumption.

(6) An example of the second type of presetting circuit, in which only one of the pair of transistors constituting the output driver is switched on, so that a through current is prevented from flowing through the pair of transistors, is disclosed for example in Japanese Patent Application Laid-Open No. 1-149290. However, in this device, a through current flows through a pair of transistors provided in a prior stage of the output driver, and similar problems to those listed above occur.

The present invention concerns the resolution of the above-mentioned technical problems, and has as its object the provision of an output circuit and electronic apparatus using the same which not only allows for short access times regardless of the load capacitance, but also eliminates the generation of a through current in the output driver, internal circuit, and so forth, and allows noise to be reduced.

Another object of the present invention is the provision of an output circuit and electronic apparatus using the same which allows for short access times even with a low power supply voltage.

Yet another object of the present invention is the provision of an output circuit and electronic apparatus using the same which, even with a presetting circuit in which no through current flows, oscillation can be prevented from occurring even when the output terminal load capacitance is low.

DISCLOSURE OF THE INVENTION

According to a first aspect of the present invention, there is provided an output circuit having output drive means including a first transistor which is connected to a power supply line and an output terminal and has a first control terminal to which is input a first control signal, and a second transistor which is connected to a ground line and the output terminal and has a second control terminal to which is input a second control signal, and based on the first and second control signals outputting a data signal from the output terminal;

at least one output preset transistor connected to at least one of the power supply line and the ground line and to the output terminal, and setting the output terminal to a potential intermediate between the power supply line potential and the ground line potential;

setting means which, before the data signal is output, controls the first and second control signals to set the first and second transistors to the off state; and shorting means which, after setting by the setting means, according to the potential state of the output terminal shorts a preset control terminal of the output preset transistor and the output terminal.

According to this aspect of the present invention, the following benefits are obtained.

(1) By setting the first and second transistors to the off state with the setting means, and shorting the preset control terminal and output terminal, the output terminal and preset control terminal are at the same potential. In other words, when the output-terminal potential is low, by means of the shorting by the shorting means, the potential of the preset control terminal of the output preset transistor connected to the power supply line is pulled down to 0 V. Next, the output preset transistor goes on, a current is supplied from the power supply line, and the potential of the output terminal rises, and thus the potential of the preset control terminal also rises. At this time, the shorting means shorts immediately after the off state, but when the shorting state is ended, the supply of power from the power supply line is stopped.

In this way, when the output terminal potential is low the potential of the output terminal can be raised, and a setting to a predetermined potential can be carried out.

On the other hand, when the output terminal potential is high, by shorting the preset control terminal of the output preset transistor connected to the ground line and the output terminal, the potential of the output terminal can be lowered to a predetermined potential.

Therefore, presetting can be carried out with the first and second transistors of the output drive means in the off state, and thus the occurrence of through currents in the output drive means can be prevented, and erroneous operation of other circuits due to noise or the like can be prevented, while providing short access times.

(2) If an output terminal, for example a drain electrode, of the output preset transistor and a preset control terminal, for example a gate electrode, are shorted, since close to the threshold voltage the current is extremely small, regardless of the magnitude of the load capacitance connected to the output terminal, the time constant is large. For this reason, before the output potential reaches the power supply potential or ground potential, the potential can be detected, and no output oscillation occurs.

Therefore, presetting is possible, whether the load capacitance is large or small, and short access times can be achieved.

(3) By using a special-purpose output preset transistor distinct from the first and second transistors of the output drive means, from the viewpoint of output noise and access times, which are determined by the peak current value and amount of current chance of the output current, the current drive ability of each of the output preset transistor and the first and second transistors can be set to be optimal.

The shorting means may comprise switch means connected between the output terminal and the preset control terminal of the output preset transistor; and output potential detection means which detects the potential of the output terminal, and based on the detected output potential controls the switch means; and wherein before the data signal is output, the output potential detection means makes the switch means conducting according to the output terminal potential, and operates the output preset transistor to set the output terminal to a predetermined potential.

By configuring the shorting means as a switch means and an output potential detection means, according as the output terminal is high or low, the at least one output preset transistor can be controlled, so that both rises and falls of the output terminal potential can be controlled freely. By this means, continuous through currents in the output preset transistors do not occur.

Again, if an output terminal of the output preset transistor, for example the drain electrode, and a preset control terminal, for example the gate electrode are shorted by the switch means, close to the threshold voltage the current is small. Therefore, regardless of the magnitude of the load capacitance connected to the output terminal, at an intermediate potential the time constant is large. For this reason, for the detection of the output terminal potential, the speed does not exceed the operation speed of the output potential detection means, and before the output potential reaches the power supply potential or ground potential, the potential can be detected, and no output oscillation occurs.

Therefore, presetting is possible, whether the load capacitance is large or small, and short access times can be achieved.

Moreover, the output preset transistor may comprise a first preset transistor, connected to the output terminal and the power supply line, and having a third control terminal; and a second preset transistor, of opposite conductivity type to the first preset transistor, connected to the output terminal and the ground line, and having a fourth control terminal. The switch means may comprise:

first switch means connected between the third control terminal of the first preset transistor and the output terminal; and second switch means connected between the fourth control terminal of the second preset transistor and the output terminal.

The third control terminal of the first preset transistor and the output terminal can be shorted by the first switch means. By this means, when the output terminal is low, a current from the power supply line connected to the first preset transistor can be supplied to the output, and a predetermined potential can be set.

On the other hand, the fourth control terminal of the second preset transistor and the output terminal can be shorted by the second switch means. By this means, when the output terminal is high, a current can flow out from the output terminal toward the preset transistor, and a predetermined potential can be set.

In this way, by using an output preset transistor for each of the power supply line and ground line sides, bi-directional presetting, that is presetting when the output changes from low to high, and presetting when the output changes from high to low, can be achieved, short access times can be achieved, and this is effective for a device driven by a low voltage.

According to a second aspect of the present invention, there is provided an output circuit which comprises output drive means including a first transistor which is connected to a power supply line and an output terminal and has a first control terminal to which is input a first control signal, and a second transistor which is connected to a ground line and the output terminal and has a second control terminal to which is input a second control signal, and based on the first and second control signals outputting a data signal from the output terminal;

setting means which, before the data signal is output, controls the first and second control signals to set the first and second transistors to the off state; and shorting means which, after setting by the setting means, according to the potential state of the output terminal shorts one of the first and second control terminals and the output terminal.

According to this aspect of the present invention, the following benefits are obtained.

(1) By setting the first and second transistors to the off state with the setting means, and shorting one of the first and second control terminals and the output terminal, o the output terminal and the one of the first and second control terminals are at the same potential. In other words, when the output terminal potential is low, the potential of the first control terminal is pulled down to 0 V, the first transistor goes on, the potential of the output terminal rises, and the current in the first control terminal also increases. At this time, the shorting means shorts immediately after the off state, but when the shorting state is ended, the supply of power from the power supply line is stopped. In this way, when the output terminal potential is low the potential of the output terminal can be raised, and a setting to a predetermined potential can be carried out.

On the other hand, when the output terminal potential is high, by shorting the second control terminal of the second transistor grounded to the ground line and the output terminal, the potential of the output terminal can be lowered to a predetermined potential.

Therefore, the first and second transistors are used alternately according as the output terminal potential is rising or falling. For this reason, presetting can be carried out with no through currents flowing between the first and second transistors, the generation of through currents in the output drive means is prevented, and peripheral circuit erroneous operation and the like can be prevented, while short access times can be achieved.

(2) If an output terminal, for example a drain electrode, of one of the transistors and a control terminal, for example a gate electrode, are shorted, since close to the threshold voltage the current is extremely small, regardless of the magnitude of the capacitance of a device, which may for example be an electronic circuit board, connected to the output terminal, the time constant is large. For this reason, before the output potential reaches the power supply potential or ground potential, the potential can be detected, and no output oscillation occurs.

Therefore, presetting is possible, whether the load capacitance is large or small, and short access times can be achieved.

(3) By using the transistors of the existing output drive means for the output presetting operation, the provision of special-purpose output preset transistors is not required, and a more compact device can be realized.

The shorting means may comprise first switch means connected between at least one of the first and second control terminals and the output terminal; and output potential detection means which detects the potential of the output terminal, and based on the detected output potential controls the first switch means. Moreover before the data signal is output, the output potential detection means makes the first switch means conducting, and operates at least one of the first and second transistors to set the output terminal to a predetermined potential intermediate between the power supply line potential and the ground line potential.

Therefore, the following benefits can be obtained.

By configuring the shorting means of a switch means and an output potential detection means, according as the output terminal is high or low, the at least one of the first and second transistors is controlled, so the both rises and falls of the output terminal potential can be controlled freely.

Additionally, by controlling the on/off operation of the first and second transistors by the output control means, for example in the case that the output terminal is low, the output terminal potential can be raised to a predetermined potential, and the first transistor can be turned off. Here, if the current supply is stopped, and the switch means is put in the off state, and then the first transistor is turned on, the rise from the predetermined potential to the power supply potential can be easily achieved.

On the other hand, for example in the case that the output terminal is high, the output terminal potential can be lowered to a predetermined potential, and the second transistor can be turned off. Here, if the current supply is stopped, and the switch means is put in the off state, and then the second transistor is turned on, the fall from the predetermined potential to the ground potential can be easily achieved. Thus by operation in combination with control of a switch means or the like, an optimum device can be obtained.

Moreover, the setting means may comprise output control means which outputs the first and second control signals to the first and second control terminals of the first and second transistors to control the first and second transistors; and second switch means connected between the output control means and at least one of the first and second control terminals, and controlled by the output potential detection means. Moreover, before the data signal is output, the output potential detection means makes the second switch means which is connected to one of the first and second control terminals non-conducting. In a state of preventing output of the data signal, the output control means operates one of the first and second transistors to set the output terminal to a predetermined potential intermediate between the power supply line potential and the ground line potential.

Therefore, the following benefits can be obtained.

(1) Regardless of the first and second control signals, the shorted state can be maintained. That is, when shorting is carried out by making the first switch means conducting, the second switch means connected to one of the first and second control terminals is non-conducting, and therefore the first or second control signal is not being supplied to the output drive means. For this reason, without being controlled by the output control means, the on state of the first or second transistor can be maintained. Moreover, in this interval, the power is supplied from the power supply line through the first transistor to the output terminal, and the potential can be raised, and a predetermined potential established. Again, a current flows out from the output terminal to the second transistor connected to the ground line, and thereby the potential of the output terminal can be lowered and a predetermined potential established. It should be noted that when presetting is completed, the first switch means becomes non-conducting, the second switch means becomes conducting, and the normal state in which the first and second control signals are supplied to the first and second transistors is returned to.

(2) Additionally, during presetting, since the second switch means is non-conducting, no current flows from the output terminal through the first switch means to the internal circuit, and thus noise can be reduced.

The second switch means may be a transmission gate which sets the output control means and at least one of the first and second control terminals to be selectively one of conducting and non-conducting in accordance with a detected potential by the output potential detection means.

Therefore, by configuring the second switch means as a transmission gate, the circuit configuration can be simplified.

The second switch means may be formed of a first conductivity type transistor and a second conductivity type transistor. Moreover, Lhe output control means comprises:

a third transistor connected to the power supply line and to the first conductivity type transistor; and a fourth transistor connected to the ground line and to the second conductivity type transistor.

Therefore, by forming a part of the output control means as transistors, together with the second switch means, the circuit configuration can be made even simpler.

Moreover, the first switch means may comprise a first switch connected between the output terminal and the first control terminal of the first transistor, and a second switch connected between the output terminal and the second control terminal of the second transistor. The second switch means may comprise a third switch connected between the first control terminal of the first transistor and the output control means, and a fourth switch connected between the second control terminal of the second transistor and the output control means. Moreover, before the data signal is output, the output potential detection means makes one of the first and second switch means conducting. The output control means operates one of the first and second transistors to set the output terminal to a predetermined potential intermediate between the power supply line potential and the ground line potential.

Therefore, potential setting is possible not only for either one of a rise and a fall, but for both rises and falls, and this is possible only with the device of the present invention. Therefore, bi-directional presetting, that is presetting when the output changes from low to high, and presetting when the output changes from high to low, can be achieved, short access times can be achieved, and this is effective for a device driven by a low voltage.

Moreover, each of the first transistor and the second switch may be formed by a transistor of a first conductivity type, each of the second transistor and the first switch may be formed by a transistor of a second conductivity type, and each of the third switch and the fourth switch may be formed by a transistor of the first conductivity type and a transistor of the second conductivity type.

Therefore, the first and second transistors of the output drive means and the switch shorting the output terminal are formed of a transistor of a first conductivity type or a second conductivity type, whereby the number of signal lines can be reduced, and the circuit scale and layout scale can be simplified, and the device can be made smaller.

Moreover, each of the first transistor, the second switch, and the third switch may be formed by a transistor of a first conductivity type, and each of the second transistor, the first switch, and the fourth switch may be formed by a transistor of a second conductivity type.

Therefore, all of the switches can be formed by a single transistor, and the circuit scale and layout area can be even further reduced, and the device can be made even yet smaller. In particular, for example a semiconductor device with a large number of output terminals, such as, for example, an 8-bit, 16-bit, or 32-bit or similar device, a smaller chip size can be achieved.

According to a third aspect of the present invention, there is provided an output circuit for outputting a data signal after setting an output terminal to a potential intermediate between a power supply line potential and a ground line potential, comprising:

potential setting means connected to the output terminal, and lowering the output terminal voltage to set the output terminal to the intermediate potential; and wherein the potential setting means has current-voltage characteristics such that as an input voltage thereto falls, a current flowing in the potential setting means falls, the rate of falling of the current with the fall in the input voltage is smaller later than initially, and when the input voltage is close to a threshold voltage of the potential setting means, the current is small.

According to this aspect of the present invention, in the case that the output terminal potential is lowered, and in the case that the output terminal potential is high, firstly the potential of the output terminal is lowered to the intermediate potential by the potential setting means. At this time, close to the threshold value of the potential setting means the current can be made small. For this reason, even if the capacitance of the circuit or the like connected to the output terminal is small, the time constant can be made large, and the speed of discharge at the intermediate potential can be made slower than the operation speed of the means which detects the output terminal potential. Therefore, before the output terminal is excessively discharged and falls too low, the potential state of the output terminal can be detected, and erroneous operation and the like of peripheral devices can be prevented.

According to a fourth aspect of the present invention, there is provided an output circuit for outputting a data signal after setting an output terminal to a potential intermediate between a power supply line potential and a ground line potential, comprising:

potential setting means connected to the output terminal, and raising the output terminal voltage to set the output terminal to the intermediate potential; and wherein the potential setting means has current-voltage characteristics such that as an input voltage thereto rises, a current flowing in the potential setting means falls, the rate of falling of the current with the rise in the input voltage is smaller later than initially, and when the input voltage is close to a threshold voltage of the potential setting means, the current is small.

According to this aspect of the present invention, in the case that the output terminal potential is raised, and in the case that the output terminal potential is low, firstly the potential of the output terminal is raised to the intermediate potential by the potential setting means. At this time, close to the threshold value of the potential setting means the current can be made small. For this reason, even if the capacitance of the circuit or the like connected to the output terminal is small, the time constant can be made large, and the speed of charge at the intermediate potential can be made slower than the operation speed of the means which detects the output terminal potential. Therefore, before the output terminal is excessively charged and rises too high, the potential state of the output terminal can be detected, and erroneous operation and the like of peripheral devices can be prevented. Therefore, preset potential setting can be carried out reliably.

The potential setting means may comprise output drive means including a first transistor connected to a power supply line and the output terminal and having a first control terminal to which is input a first control signal, and a second transistor connected to a ground line and the output terminal and having a second control terminal to which is input a second control signal, and based on the first and second control signals outputting a data signal from the output terminal;

output control means outputting the first and second control signals to the first and second control terminals of the first and second transistors to control the first and second transistors;

switch means connected between one of the first and second control terminals and the output terminal; and output potential detection means detecting the potential of the output terminal, and based on the detected output potential controlling the switch means.

Therefore, when the output potential detection means is provided, even if the output terminal has a small load capacitance, the output terminal potential state can be accurately determined, and erroneous operation of the output potential detection means or the like can be prevented.

Again, either of the first and second transistors of the output drive means can be matched to the voltage-current characteristics of the potential setting means when either raising or lowering the output potential, and the implementation of the potential setting means is made possible.

Further, the potential setting of the output terminal using the output potential detection means, under the control of the output control means, can be carried out with the first and second transistors of the output drive means off, and by controlling the switch means with the output potential detection means. At this point, by means of a switching operation of either one of the switch means, raising or lowering of the potential can be controlled by the operation of either of the first and second transistors.

The potential setting means may include at least one output preset transistor, connected to at least one of the power supply line and the ground line, and the output terminal, and setting the output terminal to a predetermined potential intermediate between the power supply line potential and the ground line potential.

Therefore, the voltage-current characteristics of the potential setting means can be obtained by means of the characteristics of the output preset transistor.

Moreover, the presetting operation of setting the output terminal to a predetermined potential intermediate between the power supply line potential and the ground line potential is controlled based on a pulse signal generated by detecting a transition in address signals.

By this means, the output circuit of the present invention can also be used for example in an asynchronous semiconductor memory device or the like.

According to a fifth aspect of the present invention, there is provided an electronic instrument incorporating the above-described output circuit.

According to this aspect of the present invention, an electronic instrument with low power consumption can be implemented, and moreover noise and the like can be reliably reduced, and erroneous operation or the like of other devices within the electronic instrument can be prevented.

BEST MODE FOR CARRYING OUT THE INVENTION

The present invention is now described in terms of a number of preferred embodiments, with reference to the drawings.

First Embodiment
Overall configuration

First, before describing the output circuit whose configuration is characteristic of the present invention, the overall configuration of an example semiconductor memory device using the output circuit is described with reference to FIG. 1.

Figure 1:
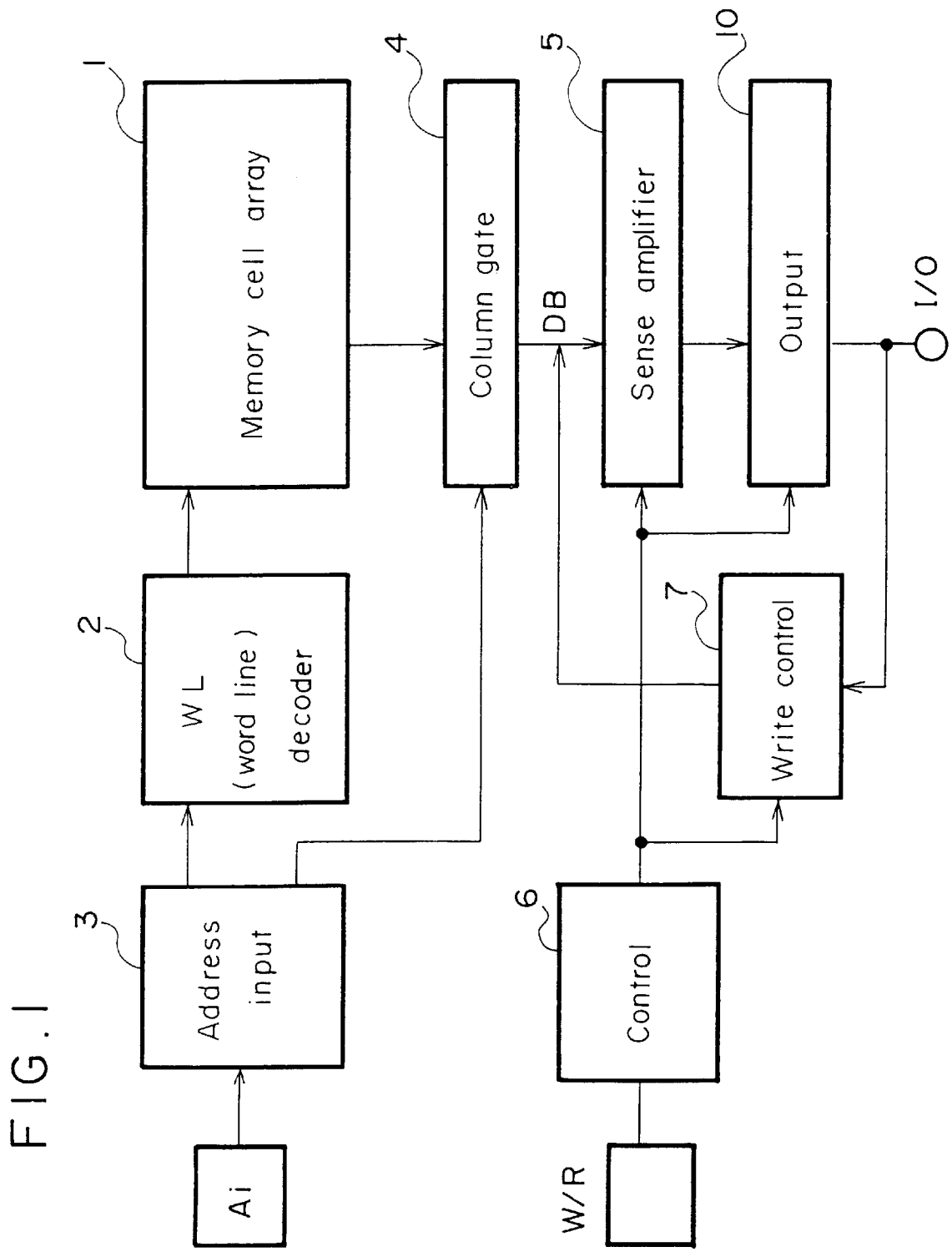
FIG. 1 is a block diagram showing the overall configuration of the semiconductor device of the present invention.

The semiconductor memory device, such as a RAM, has as shown in FIG. 1 a memory cell array 1 which is laid out in a matrix, and includes bit lines and word lines not shown in the figure.

Then by inputting address signals Al output by a control means such as a CPU to an address input section 3, through the WL (word line) decoder 2 and column gate 4, the word lines and bit lines are selectively accessed, and a particular memory cell position is specified.

For reading, the signals from the memory cell pass through the column gate 4 and are amplified by a sense amplifier 5, then output to I/O by an output circuit 10. At this time, a control section 6 enables operation of the sense amplifier 5 and output circuit 10.

On the other hand, for writing, signals from I/O are subject to data processing in a write control section 7, and are transferred to a data bus (DB), and at the same time through the WL decoder 2 and column gate 4, the word lines and bit lines are selected, and data is written to a memory cell. At this time, the sense amplifier 5 and output circuit 10 are inhibited by the control section 6.

It should be noted that in the case of a semiconductor memory device such as a ROM, the configuration excludes the above-mentioned configuration necessary for writing.

Output circuit

Next, the output circuit which is a characteristic configuration of the present invention is described with reference to FIG. 2.

The output circuit of the present invention is a circuit which sets the output terminal $D_{out}$ to a predetermined potential intermediate between the power supply line potential and ground line potential before data signals D and xD are output. The output circuit includes an output drive means 30, output preset transistor circuit 40, a shorting means 50A and a setting means 22A.

The output drive means 30 includes a Pch transistor 31 being a first transistor connected to a power supply line and the output terminal $D_{out}$, and an Nch transistor 32 being a second transistor connected to a ground line and the output terminal $D_{out}$. The transistors 31 and 32 output data signals D and xD from the output terminal $D_{out}$ based on first and second control signals input to first and second control terminals such as a gate electrode DP and a gate electrode DN.

The output preset transistor circuit 40 is connected to the output terminal $D_{out}$ and at least one of the power supply line and ground line, and serves to set the output terminal $D_{out}$ to a potential intermediate between the power supply line potential and ground line potential. The output preset transistor circuit 40 comprises a Pch transistor 41 as a first preset transistor connected to the output terminal $D_{out}$ and a power supply line. It further comprises an Nch transistor 42 as a second preset transistor, of opposite conductivity type to the first preset transistor, connected to the output terminal $D_{out}$ and a ground line.

The shorting means 50A has the function, after setting (of the transistors 31 and 32 to the off state) by the setting means 22A during the emission of pulses as described below, of, according to the potential state of the output terminal $D_{out}$ shorting at least one of the control terminals (for example, the gate electrode GP and gate electrode GN) of the output preset transistor circuit 40, and the output terminal $D_{out}$. Again, the shorting means 50A includes a switch means 60 and output potential detection means 70.

The switch means 60 is connected between the output terminal $D_{out}$ and the gate electrodes of the output preset transistor circuit 40. The switch means 60 further comprises a first switch 62 connected between the gate electrode GP being a third control terminal of the Pch transistor 41 and the output terminal $D_{out}$. And it further comprises a second switch 64 connected between the gate electrode GN being a fourth control terminal of the Nch transistor 42 and the output terminal $D_{out}$.

The first switch 62 is constituted as a transmission gate comprising a Pch transistor 62a and Nch transistor 62b. The second switch 64 is constituted as a transmission gate comprising a Pch transistor 64a and Nch transistor 64b.

The output potential detection means 70 detects the output terminal potential, and has the function of controlling this switch means 60 based on this detected output potential.

The output potential detection means 70 comprises a NOR gate 71 and inverter 72 which control the first switch 62 according to the potential of the output terminal $D_{out}$. And it comprises a NAND gate 73 and inverter 74 which control the second switch 64 according to the potential of the output terminal $D_{out}$.

The NOR gate 71 and NAND gate 73 are controlled by a preset control signal PSET. When the preset control signal PSET is low, the first and second switches 62 and 64 become non-conducting, and when the preset control signal PSET is high, according to the potential level of the output terminal $D_{out}$, one of the first and second switch means 62 and 64 becomes conducting.

The setting means 22A has the function of controlling control signals (such as the signals DP and DN shown in FIG. 3A) input to the gate electrodes DP and DN of transistors 31 and 32 before the data signals D and xD which are the output from sense amplifiers, and for example during the emission of a pulse of the preset control signal PSET which is a pulse signal which is generated consequent on the detection of a change in the address signals Ai (for example, in the interval which is high in FIG. 3A), and of setting the transistors 31 and 32 to the off state. This setting means 22A includes an output control means 80.

The output control means 80 inputs control signals to the gate electrodes DP and DN of transistors 31 and 32, thereby serving to control the transistors 31 and 32 of the output drive means 30. The output control means 80 has a NAND gate 82 and an inverter 83 which control the Nch transistor 32 based on internal data D and output control signals OE. And it has a NAND gate 81 which controls the Pch transistor 31 based on internal data xD and output control signals OE.

Operation

Next, the operation of an output circuit with the above-mentioned configuration is described with reference to FIGS. 2, 3A, and 3. FIG. 3 is a timing chart showing operating waveforms of the circuit of FIG. 2, and also shows current waveforms $I_{op}$ and $I_{on}$ of the output drive means and current waveforms $I_{psp}$ and $I_{psn}$ of the output preset transistor. In particular, FIG. 3A shows the case where the output capacitance $C_L$ is a large cad capacitance of 100 pF or more, and FIG. 3B shows the case where $C_L$ is a small load capacitance of several picofarads.

(i) $C_L$=large load capacitance

A. When the output terminal $D_{out}$ potential goes from low to high

Figure 3A:
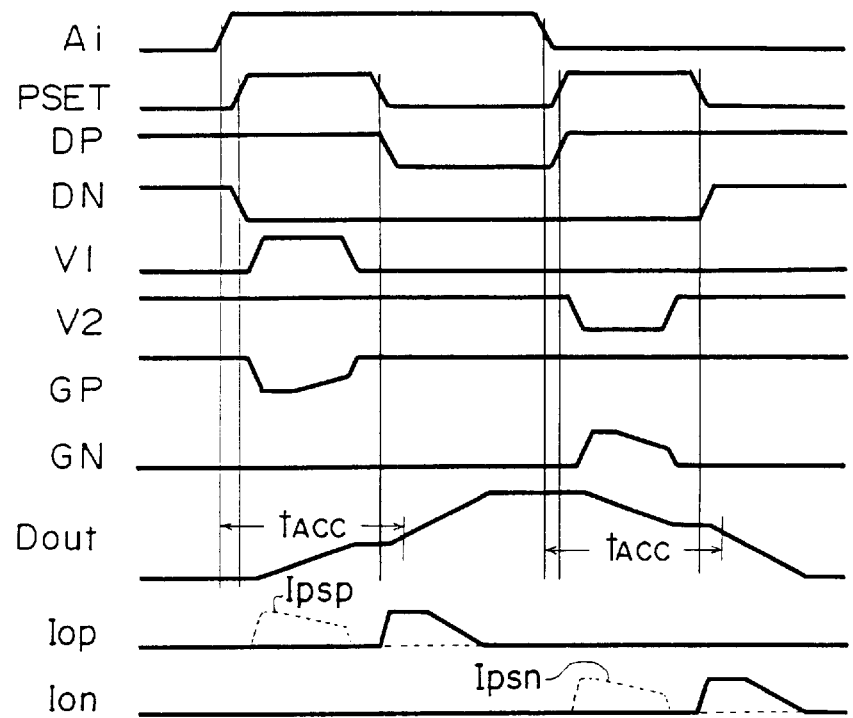
FIG. 3A is an operating waveform diagram of the output circuit of FIG. 2, in which the output capacitance is a large load capacitance.

With reference to FIG. 3A, the operation in which the output terminal $D_{out}$ to which an output capacitance of around 100 pF is connected goes from low to high with a change in the address input Ai is described.

By means of a change in internal data D not shown in the figure in response to the change in the address input Ai, the gate signal of the gate electrode DN falls, and the Nch transistor 32 goes off. The Pch transistor 31 is also off (Step A1).

At the same time, for example when a preset control signal PSET generated in response to a change in the address input Al goes high, an output potential detection means 70 is activated, and the potential level of the output terminal $D_{out}$ is determined.

At this time, since the output terminal $D_{out}$ is low, the output $V_1$ of the NOR gate 71 goes high, and the first switch 62 becomes conducting, and the second switch 64 becomes non-conducting (Step A2).

Next, the gate electrode GP of the Pch transistor 41 and the output terminal $D_{out}$ being a drain electrode are shorted, and are then at the same potential. For this reason, since the output terminal $D_{out}$ has a higher capacitance (100 pF) than the gate electrode GP (generally several picofarads), the gate electrode GP is pulled down to approximately 0 V.

Therefore, the Pch transistor 41 becomes conducting (on), and by means of the current $I_{psp}$ the output terminal $D_{out}$ begins to rise.

Since the output terminal $D_{out}$ and gate electrode GP are at the same potential, the potential of GP also rises together with the output terminal $D_{out}$ (Step A3).

Figure 4A:
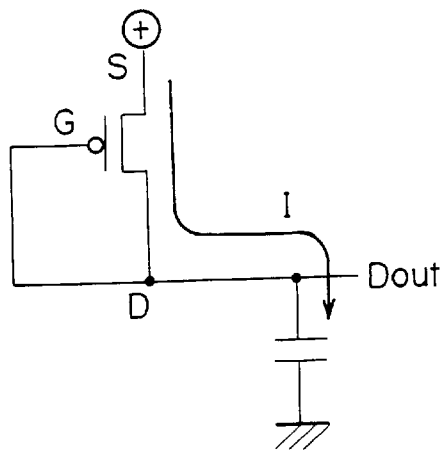
FIG. 4A is a circuit diagram showing the output circuit of the present invention in which the gate electrode and drain electrode of the Pch transistor are shorted.
Figure 4B:
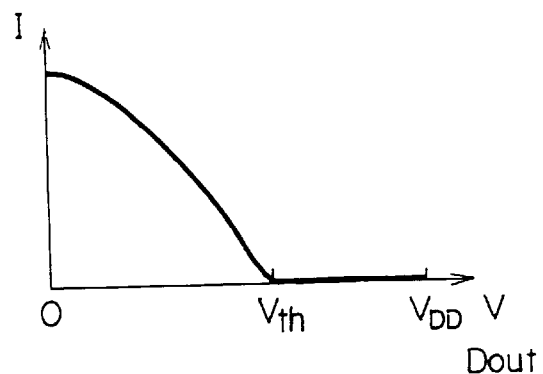
FIG. 4B is a characteristics diagram showing the relation between the current I and the potential V of the output terminal $D_{out}$ in the circuit of FIG. 4A.

When the gate electrode GP and drain electrode of the Pch transistor 41 are shorted by the first switch 62 (see FIG. 4A), the characteristics of the Pch transistor 41 are as shown in FIG. 4B. In other words, the characteristics of the Pch transistor are such as when the output terminal $D_{out}$ is at 0 V to be "on", and when "on", as the potential of the output terminal $D_{out}$ rises, the voltage between the gate and source of the Pch transistor 41 falls, as a result of which the current drive ability (referred to hereinafter as "ability") is reduced. It should be noted that close to the threshold value the current is low. Therefore, the current $I_{psp}$ is reduced, and the degree of rising of the output terminal $D_{out}$ is reduced (Step A4).

When, eventually, the potential of the output terminal $D_{out}$ reaches the logic level of the NOR gate 71 of the output potential detection means 70 or more, or when the preset control signal PSET goes low, the output $V_1$ of the NOR gate 71 goes low.

Then the first switch 62 becomes non-conducting, the gate potential GP goes to the power supply potential by virtue of the transistor 91, the Pch transistor 41 goes off, and the preset operation is stopped (Step A5).

By previously setting the logic level of the NAND gate 73 higher than the logic level of the NOR gate 71, the second switch 64 does not conduct, and the Nch transistor 42 also does not conduct.

In this way, the output terminal $D_{out}$ is set to an intermediate potential. Thereafter, reflecting a new address an internal data signal xD not shown in the figure goes high, the Pch transistor 31 goes on, and the output terminal $D_{out}$ rises to the power supply potential (Step A6).

B. When the output terminal $D_{out}$ potential goes from high to low

When the output of the output terminal $D_{out}$ goes from high to low, by means of a change in internal data xD not shown in the figure in response to the change in the address input Ai, the gate signal of the gate electrode DP rises, and the Pch transistor 31 goes off. The Nch transistor 32 is also off (Step B1).

At the same time, for example when a preset control signal PSET generated in response to a change in the address input Ai goes high, an output potential detection means 70 is activated, and the potential level of the output terminal $D_{out}$ is determined.

At this time, since the output terminal $D_{out}$ is high, the output $V_2$ of the NAND gate 73 goes low, and the first switch 62 becomes non-conducting, and the second switch 64 becomes conducting (Step B2).

Next, the gate electrode ON of the Nch transistor 42 and the output terminal $D_{out}$ being a drain electrode are shorted, and are then at the same potential. For this reason, since the output terminal $D_{out}$ has a higher capacitance (100 pF) than the gate electrode GN (generally several picofarads), the gate electrode GP is pulled up to approximately the power supply potential. Therefore, the Nch transistor 42 becomes conducting (on), and by means of the current $I_{psn}$ the output terminal $D_{out}$ begins to fall. Since the output terminal $D_{out}$ and GN are at the same potential, the potential of the gate electrode GN also falls together with the output terminal $D_{out}$ (Step B3).

Figure 4C:
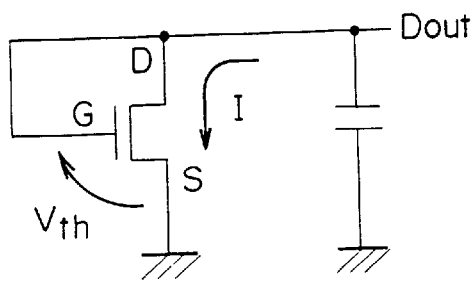
FIG. 4C is a circuit diagram showing the output circuit of the present invention in which the gate electrode and drain electrode of the Nch transistor are shorted.
Figure 4D:
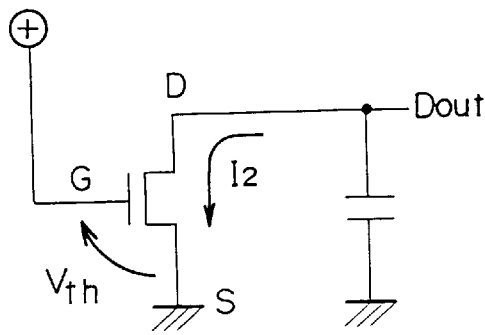
FIG. 4D is a circuit diagram of the Nch transistor portion of a conventional output circuit.
Figure 4E:
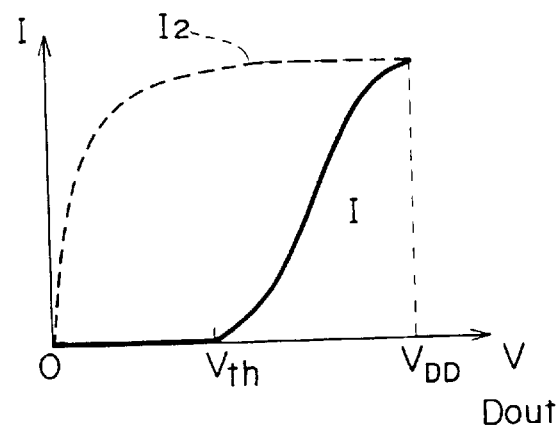
FIG. 4E is a characteristics diagram showing comparatively the relation between the current I and the potential V of the output terminal $D_{out}$ in the circuit of FIG. 4C and between the current $I_2$ and the potential V of the output terminal $D_{out}$ in the circuit of FIG. 4D.

When the gate electrode GN and drain electrode of the Nch transistor 42 are shorted by the second switch 64 (see FIG. 4C), the characteristics of the Nch transistor 42 are as shown in FIG. 4E. In other words, the characteristics of the Nch transistor are such as when the output terminal $D_{out}$ is at the power supply voltage to be "on", and when "on", as the potential of the output terminal $D_{out}$ falls, the voltage between the gate and source of the Nch transistor 42 falls, as a result of which the power is reduced. It should be noted that close to the threshold value the current is low. Therefore, the current $I_{psn}$ is reduced, and the degree of falling of the output terminal $D_{out}$ is reduced (Step B4).

When, eventually, the potential of the output terminal $D_{out}$ reaches the logic level of the NAND gate 73 of the output potential detection means 70 or less, or when the preset control signal PSET goes low, the output $V_2$ of the NAND gate 73 goes high.

Then the second switch 64 becomes non-conducting, the gate potential GN goes to 0 V by virtue of the transistor 92, o the Nch transistor 42 goes off, and the preset operation is stopped (Step B5).

By previously setting the logic level of the NAND gate 73 higher than the logic level of the NOR gate 71, the first switch 62 does not conduct, and the Pch transistor 41 also does not conduct.

In this way, the output terminal $D_{out}$ is set to an intermediate potential. Thereafter, reflecting a new address an internal data signal D not shown in the figure goes high, the Nch transistor 32 goes on, and the output terminal $D_{out}$ falls to 0 V (Step B6).

(ii) $C_L$=small load capacitance

A. When the output terminal $D_{out}$ potential goes from low to high

Figure 2:
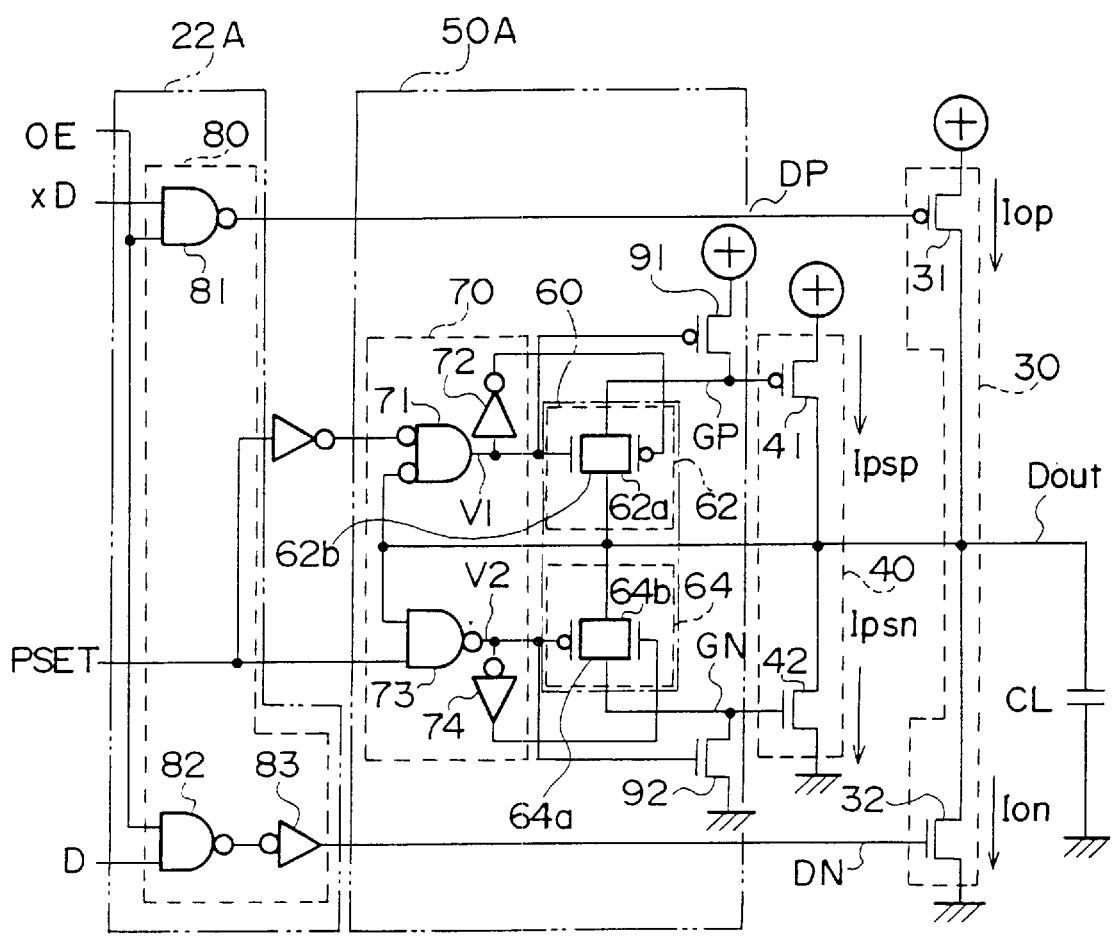
FIG. 2 is a circuit diagram of a first embodiment of the output circuit according to the present invention.
Figure 3B:
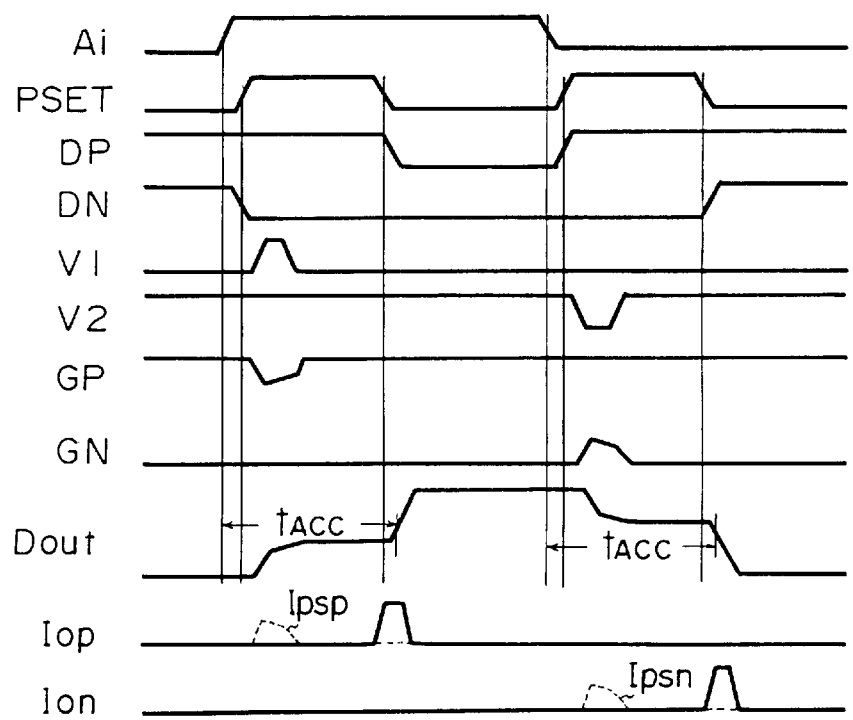
FIG. 3B is an operating waveform diagram of the output circuit of FIG. 2, in which the output capacitance is a small load capacitance.

With reference to FIGS. 2 and 3B, the operation in which the output terminal $D_{out}$ to which a small load capacitance connected goes from low to high with a change in the address input Ai is now described.

In the same way as in the operation described above for steps S-A1 and S-A2, the first switch 62 becomes conducting. Here, the gate electrode GP and the output terminal $D_{out}$ reach the same potential, but since the terminal capacitance of the output terminal $D_{out}$ and the gate electrode GP capacitance are approximately the same, the output terminal $D_{out}$ goes to an intermediate potential determined by the capacitance ratio of the output terminal $D_{out}$ and gate electrode GP.

Thereafter, in the same way as in step A3, sine the Pch transistor 41 goes on, the output terminal $D_{out}$ rises.

In step A4, close to the threshold voltage of the Pch transistor 41, the power of the Pch transistor 41 is severely reduced. For this reason, the time constant $\tau$=RC=(V/I) C is large, because even though C is a small load capacitance, the current is small.

Therefore, when the output terminal $D_{out}$ is at the intermediate potential, the rate at which the potential of the output terminal $D_{out}$ rises does not exceed the speed of operation of the output potential detection means 80, and oscillation of the conventional nature can be prevented.

In this way, even when the preset control signal PSET is high, if the potential of the output terminal $D_{out}$ goes to the logic level of the NOR gate 71 or more, the first switch 62 is non-conducting, the potential of the gate electrode GP goes to the power supply potential, and the Pch transistor 41, with the output terminal $D_{out}$ at the intermediate potential, goes off, and the preset operation is stopped (Step A5).

Thereafter, an internal data signal xD not shown in the figure goes high, and by virtue of the Pch transistor 31, the output terminal $D_{out}$ goes to the power supply potential (Step A6).

B. When the output terminal $D_{out}$ potential goes from high to low

When the output terminal $D_{out}$ potential goes from high to low, in the same way as in the operation described above for steps S-B1 and S-B2, the second switch 64 becomes conducting.

The gate electrode GN and the output terminal $D_{out}$ reach the same potential, but since the terminal capacitance of the output terminal $D_{out}$ and the gate electrode GN capacitance are approximately the same, the output terminal $D_{out}$ goes to an intermediate potential determined by the capacitance ratio of the output terminal $D_{out}$ and GN.

Thereafter, in the same way as in step B3, sine the Nch transistor 42 goes on, the output terminal $D_{out}$ falls.

In step A4, close to the threshold voltage of the Nch transistor 42, the power of the Nch transistor 42 is severely reduced.

In the conventional device of prior art 2 mentioned above, in the case that the potential of the output terminal is pulled down by an Nch transistor, during the presetting operation, since the circuit is configured as shown in FIG. 4D, the output voltage-current characteristics are such, as shown by the broken line $I_2$ in FIG. 4E, that even when the output voltage $D_{out}$ potential is close to 0 V the current is large. For this reason, when the capacitance is small, the time constant $\tau$=RC=(V/I) C is small, and the rate at which the output terminal $D_{out}$ falls is faster than the detection speed of the output potential detection means, which results in an erroneous decision, and creates the problem of oscillation.

In contrast to this, in the present embodiment, as shown in FIG. 4C, since the gate electrode and drain electrode are shorted, the Nch transistor has characteristics like those shown as I in FIG. 4E, and close to the threshold $V_{th}$ the current is small.

Therefore, when the potential of the output terminal $D_{out}$ is lowered, the current near the threshold $V_{th}$ can be made extremely small. For this reason, even when the capacitance of the circuit to which the output terminal $D_{out}$ is connected is small, the time constant can be made large.

By this means, when detecting the output terminal $D_{out}$, the discharge rate at the intermediate potential can be made slower than the operation speed of the output potential detection means 70, and before the output terminal has been subject to excessive discharge, the potential state of the output terminal can be detected, so that no oscillation occurs in the output, and erroneous operation of peripheral devices or the like can be prevented.

Thus, even when the preset control signal PSET is high, if the potential of the output terminal $D_{out}$ goes to the logic level of the NAND gate 73 or less, the second switch 64 is non-conducting, the potential of the gate electrode GN goes to 0 V, and the Nch transistor 42, with the output terminal $D_{out}$ at the intermediate potential, goes off, and the preset operation is stopped (Step B5).

Thereafter, in the same way as in step B6, the output terminal $D_{out}$ falls to the ground line potential.

Next, other characteristics of this output circuit are described.

Figure 5A:
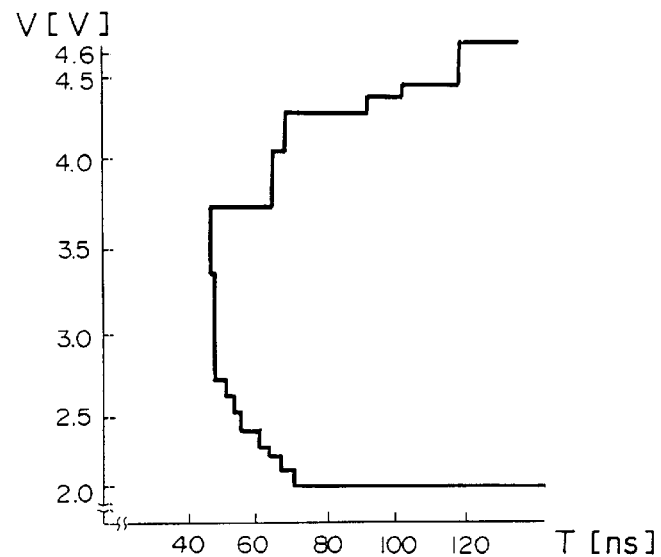
FIG. 5A shows the relation between data access time T and power supply voltage V in an output circuit without presetting.
Figure 5B:
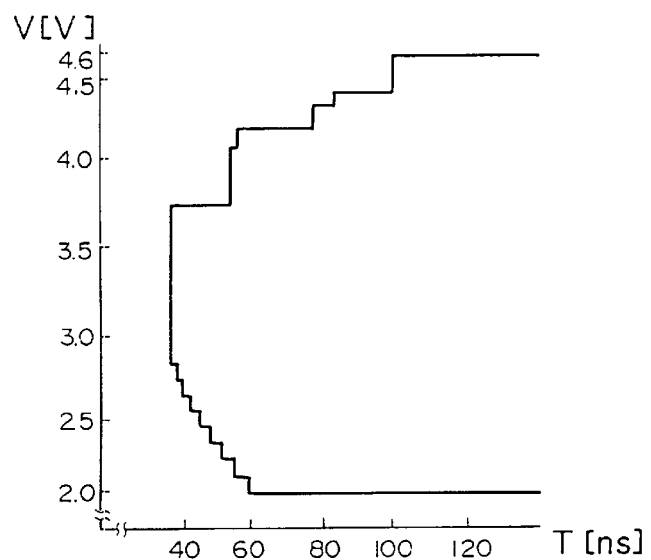
FIG. 5B shows the relation between data access time T and power supply voltage V in a conventional output circuit.
Figure 5C:
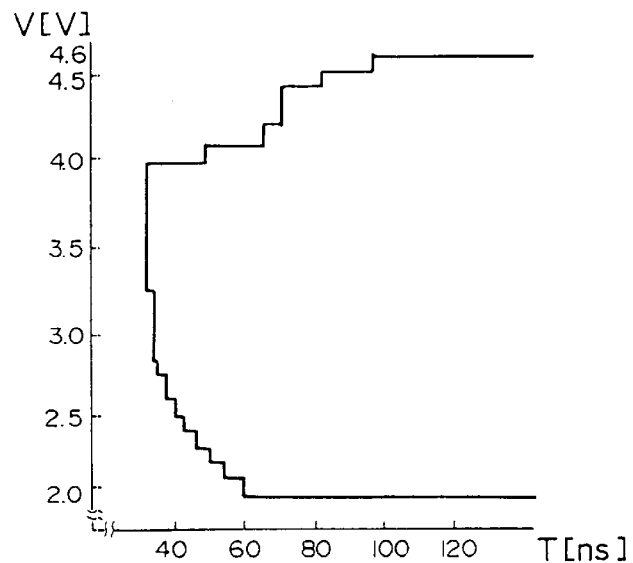
FIG. 5C shows the relation between data access time T and power supply voltage V in the output circuit of the present invention.

This output circuit has the characteristics shown in FIG. 5C. FIG. 5 shows the relationship between the time to confirm a data value (access time) and the power supply voltage, and shows characteristics of a semiconductor device with a power supply voltage specification of 3 V±10% (2.7 to 3.3 V). FIG. 5A shows the case with no preset, FIG. 5B shows the conventional case, and FIG. 5C shows the case of the present embodiment.

In the same figure, even when the power supply voltage is large, access times are short, and the width of the power supply voltage is increased. Therefore, the ability of the output circuit to be used in a general-purpose way for a variety of devices is increased.

Additionally, if the power supply voltage is 4.0 V or less, then reaccessing is not necessary, and the time to confirm a data value (access time) is also shorter than with a conventional type and than with a type without preset. For this reason, regardless of the load capacitance the noise can be reduced, and high speed access is achieved, which also increases the general-purpose applicability.

The above first embodiment provides the following benefits.

(1) Presetting can be achieved with the transistors of the output drive means all in the off state, through currents in the output drive means can be prevented from occurring, erroneous operation of the circuit due to noise or the like can be prevented, and at the same time, high speed access can be achieved. The current consumption is also low.

(2) Since the two output preset transistors are used alternately as the output terminal potential rises and falls, no through currents flow between the output preset transistors. Further, the power consumption, noise and the like can be reduced, and overall erroneous operation of the circuit can be prevented.

(3) By providing output preset transistors for both the power supply line and ground line potentials, presetting is achieved in both directions, when the output goes from low to high and when the output goes from high to low, and even faster access times are achieved, and this is effective for a low voltage drive device.

(4) Under high output load conditions, the output preset transistors are driven with sufficiently large drive ability and at high speed to set the output terminal to the intermediate potential, and under low load conditions during the presetting interval the preset operation can be carried out with no output oscillation. For this reason, high speed access, low current consumption, and low noise can be achieved. In particular, for devices with 8-bit, 16-bit, 32-bit, and other multiple output terminals, this benefit is large, and in application to semiconductor memory devices this will make a contribution to faster devices.

(5) By the use of dedicated preset transistors separate from the first and second transistors of the output drive means, from the viewpoint of the output noise and access times which are determined by the peak values of the output currents $I_{psn}$, $I_{on}$, $I_{psp}$ and $I_{op}$, and the amounts of change in the currents, the current drive ability of each of the first and second transistors and output preset transistors can be set to optimum values. Therefore, devices providing high speed access and low noise can be achieved.

(6) During the presetting interval, no current flows into the internal circuit from the output terminal through the switch means, and the noise level is low.

(7) If the drain electrode and gate electrode of the output preset transistors are shorted, close to the threshold voltage the current is extremely small. For this reason, regardless of the size of the load capacitance connected to the output terminal, the time constant is large, and for the detection of the potential of the output terminal, the speed is not greater than the operation speed of the output potential detection means. Therefore, the potential can be detected before the output potential reaches the power supply potential or ground potential, and oscillation in the output is avoided. Therefore, presetting can be achieved regardless of the size of the load capacitance, and short access times can be achieved.

Second Embodiment

Next, a second embodiment of the present invention is described with reference to FIGS. 6 and 7. It should be noted that description is omitted where substantially the same as in the first embodiment above, and only those points of difference are discussed.

Figure 6:
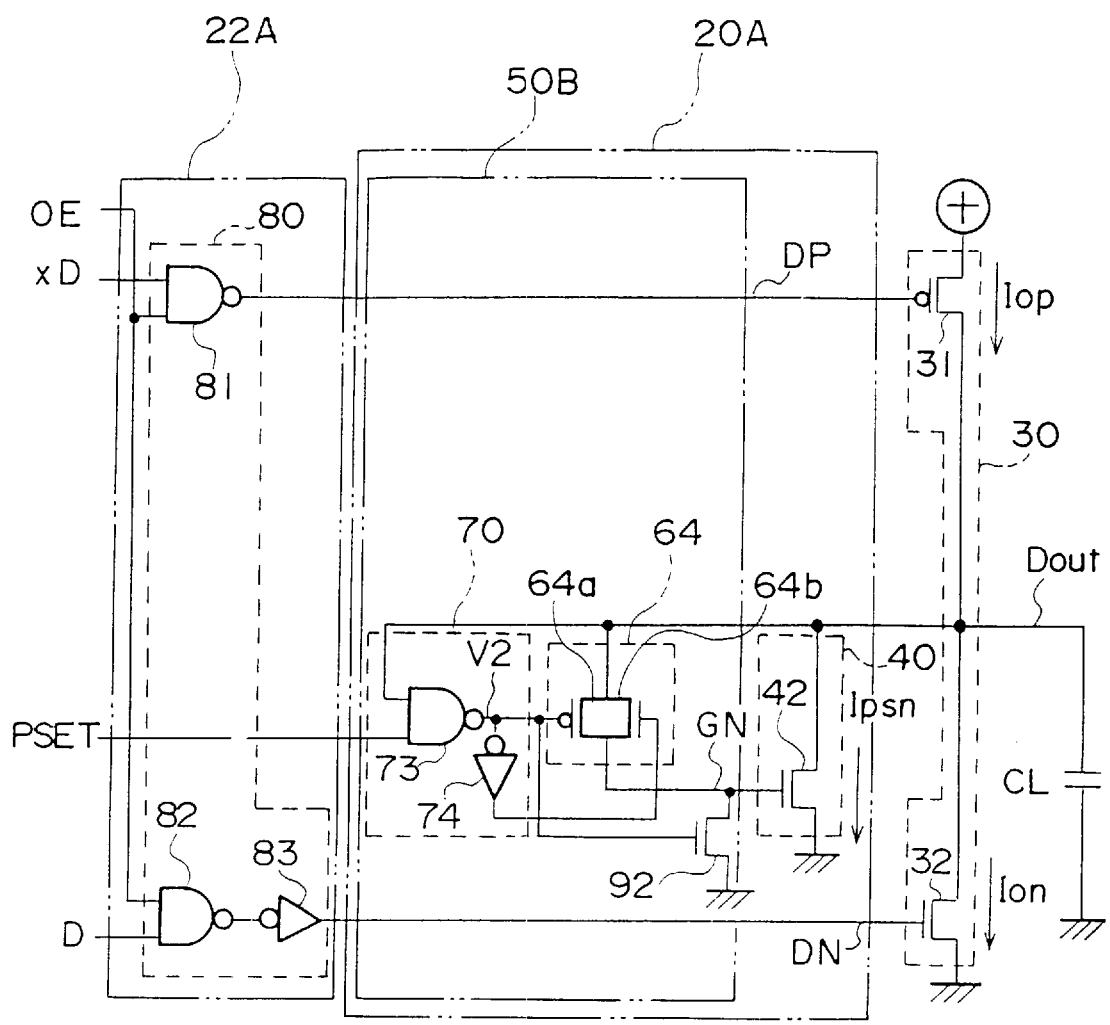
FIG. 6 is a circuit diagram of a second embodiment of the output circuit according to the present invention.

The output circuit in this second embodiment provides, as shown in Fig. 6, a configuration in which an intermediate potential is established only when, in the above-mentioned first embodiment, the output terminal $D_{out}$ changes from high to low.

In this case, the output preset transistor circuit 40 comprises only an Nch transistor 42, the output potential detection means 70 comprises only a NAND gate 73 and inverter 74, and the switch means 60 comprises only a second switch 64. The operating waveforms are the same as in FIG. 3 except for the change from low to high.

It should be noted that in this embodiment the output preset transistor circuit 40 and shorting means 50B together comprise a potential setting means 20A.

This potential setting means 20A, as shown in FIG. 6, is connected to the output terminal $D_{out}$, and serves to lower the voltage of the terminal $D_{out}$, and set the output terminal $D_{out}$ to a predetermined voltage. Again, as shown in FIG. 4E, the potential setting means 20A has input thereto a voltage V which falls over time, and has current-voltage characteristics such that as the voltage V falls the current I falls, and the rate of falling of the current as the voltage falls is, compared with its initial value, later smaller, and moreover, when the input voltage V is close to the threshold voltage $V_{th}$ of the potential setting means 20A, the current I flowing in the potential setting means 20A is small.

Therefore, the potential setting means 20A is not restricted to the configuration shown in FIG. 6 above, but essentially may have any configuration which has the characteristics shown in FIG. 4E.

Then when the potential of the output terminal $D_{out}$ is lowered, and the potential of the output terminal $D_{out}$ is close to the threshold, the current can be made extremely small.

For this reason, even when the capacitance of a circuit or the like to be connected to the output terminal is small, the time constant can be made large, and the speed of discharge at the intermediate potential can be made slower than the operation speed of the output potential detection means.

Therefore, before the output terminal is excessively discharged and falls too low, the potential state of the output terminal can be detected, and erroneous operation and the like of peripheral devices can be prevented.

Third Embodiment

Next, a third embodiment of the present invention is described with reference to FIGS. 8 and 9.

Figure 8:
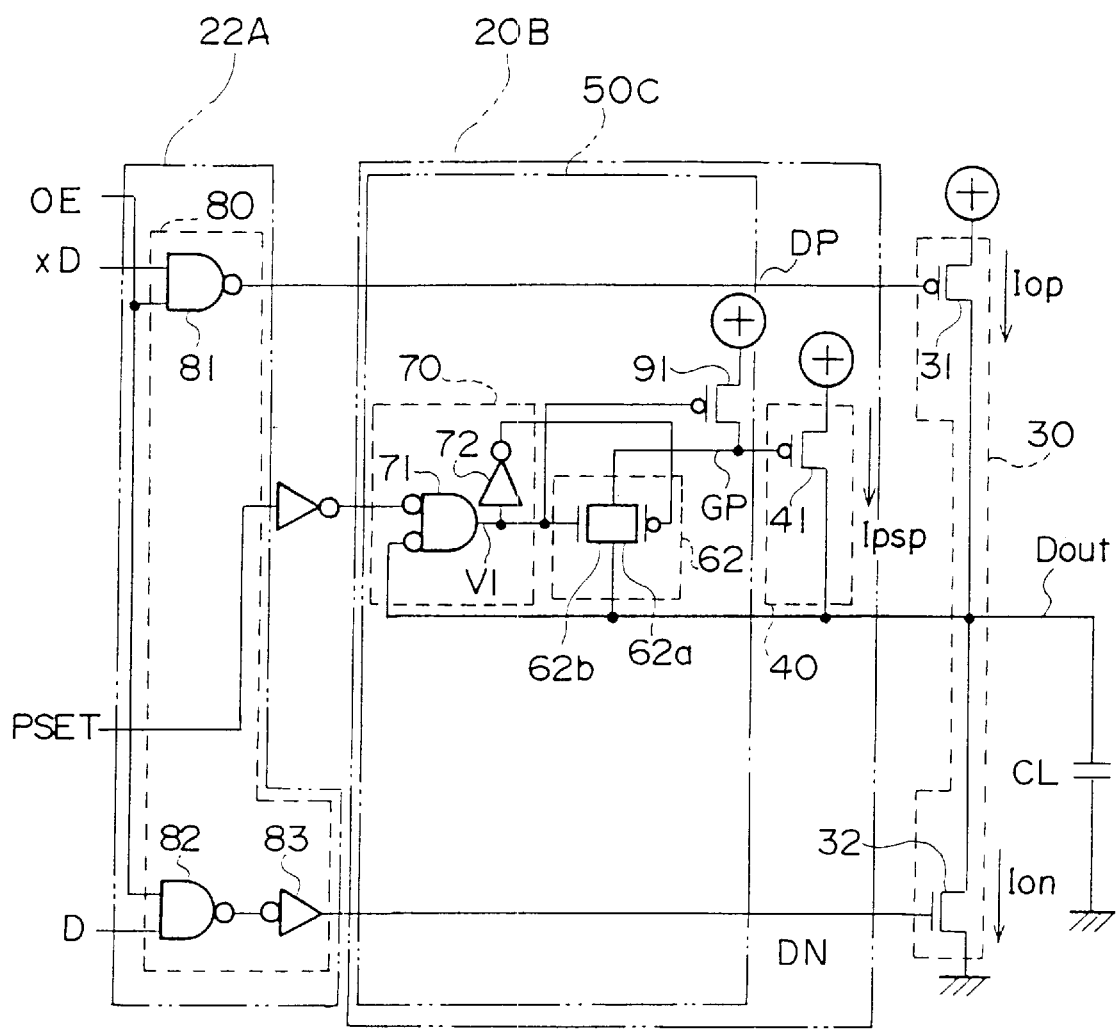
FIG. 8 is a circuit diagram of a third embodiment of the output circuit according to the present invention.
Figure 9A:
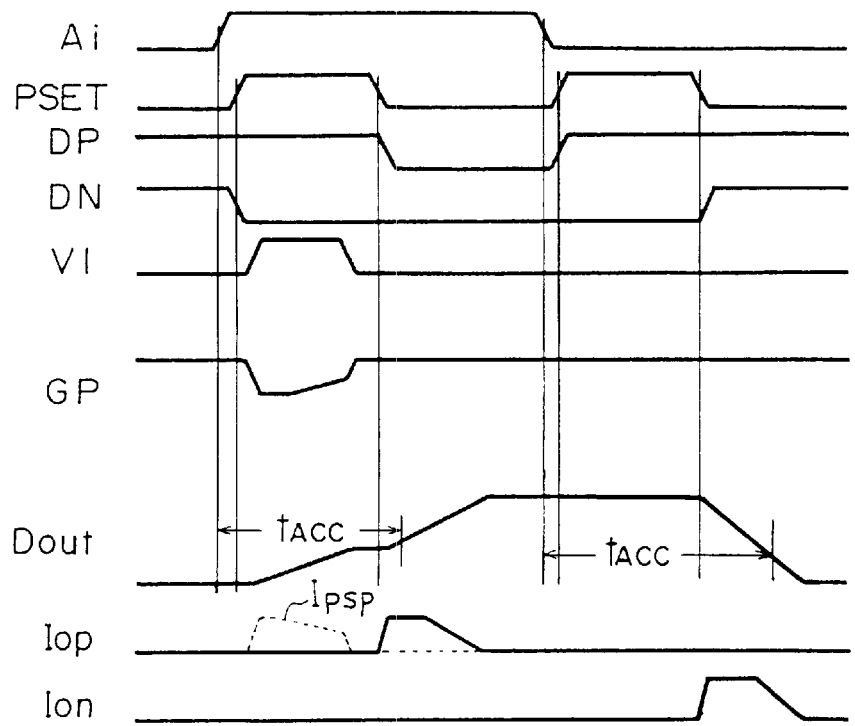
FIG. 9A is an operating waveform diagram of the output circuit of FIG. 8, in which the output capacitance is a large load capacitance.
Figure 9B:
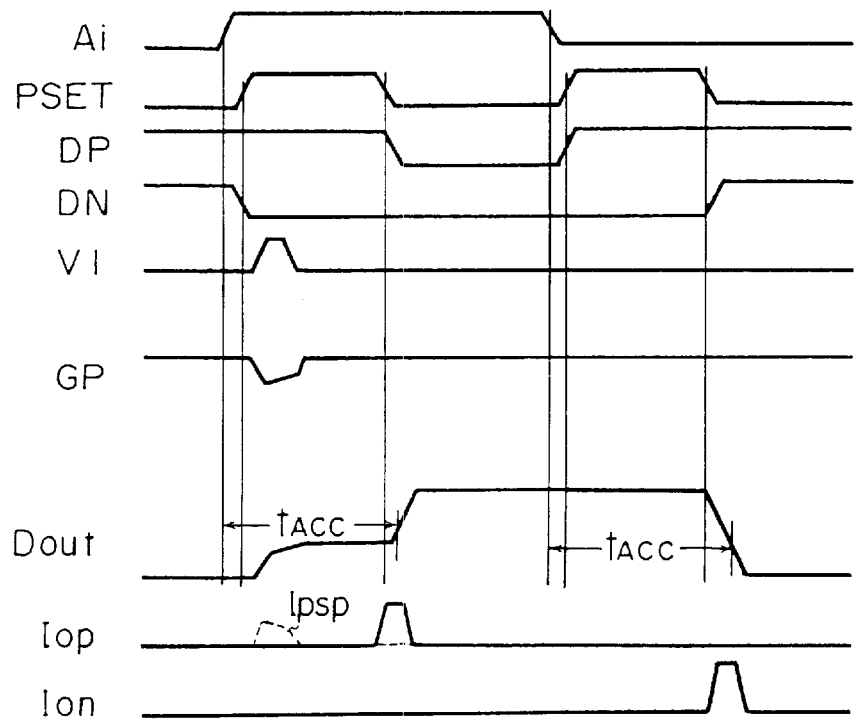
FIG. 9B is an operating waveform diagram of the output circuit of FIG. 8, in which the output capacitance is a small load capacitance.

The output circuit in this third embodiment provides, as shown in FIG. 8, a configuration in which an intermediate potential is established only when, in the above-mentioned first embodiment the output terminal $D_{out}$ changes from low to high.

In this case, the output preset transistor circuit 40 comprises only a Pch transistor 41, the output potential detection means 70 comprises only a NOR gate 71 and inverter 72, and the switch means 60 comprises only a first switch 62. The operating waveforms are the same as in FIG. 3 except for the change from high to low.

It should be noted that in this embodiment the output preset transistor circuit 40 and shorting means 50C together comprise a potential setting means 20B.

This potential setting means 20B is connected to the output terminal $D_{out}$, and serves to raise the voltage of the terminal $D_{out}$, and set the output terminal $D_{out}$ to a predetermined voltage. Again, the potential setting means 20B has input thereto a voltage V which rises over time, and has current-voltage characteristics such that as the voltage V rises the current I falls, and the rate of falling of the current as the voltage rises is, compared with its initial value, later smaller, and moreover, when the input voltage V is close to the threshold voltage $V_{th}$ of the potential setting means 20B, the current I flowing in the potential setting means 20B is small.

Therefore, the potential setting means 20B is not restricted to the configuration shown in FIG. 8 above, but essentially may have any configuration which has the characteristics shown in FIG. 4B.

Then when the potential of the output terminal $D_{out}$ is raised, and the potential of the output terminal $D_{out}$ is close to the threshold, the current can be made extremely small.

For this reason, even when the capacitance of a circuit or the like to be connected to the output terminal $D_{out}$ is small, the time constant can be made large, and the speed of charge at the intermediate potential can be made slower than the operation speed of the output potential detection means.

Therefore, before the output terminal is excessively charged and rises too high, oscillation or the like does not occur in the output, and erroneous operation and the like of peripheral devices can be prevented.

Fourth Embodiment

Next, a fourth embodiment of the present invention is described with reference to FIGS. 10 and 11.

Figure 10:
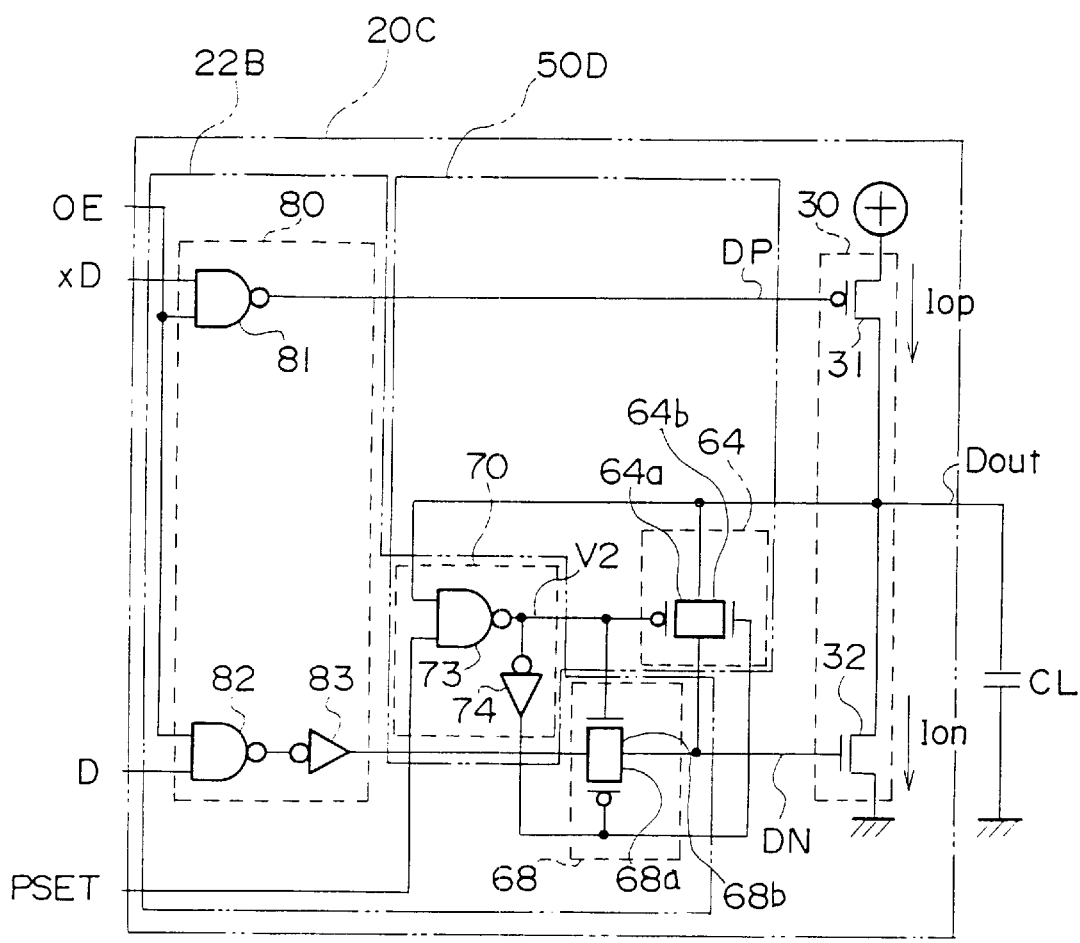
FIG. 10 is a circuit diagram of a fourth embodiment of the output circuit according to the present invention.

The device of FIG. 10 comprises an output terminal $D_{out}$ and a potential setting means 20C.

The potential setting means 20C comprises a shorting means 50D and a setting means 22B.

The shorting means 50D comprises a switch 64 as a first switch means connected between a control terminal gate electrode DN of the second transistor 32 of the output drive means 30 and the output terminal $D_{out}$. It further comprises an output potential detection means 70 which detects the potential of the output terminal $D_{out}$, and based on the detected output potential, controls the switch 64.

The setting means 22B also comprises the output potential detection means 70. Further, it comprises an output control means 80 which by inputting control signals to first and second control terminals such as the gate electrode DP and the gate electrode DN of the first and second transistors 31 and 32 controls the transistors 31 and 32 of the output drive means 30. Further, it comprises a switch 68 being a second switch means, connected between the output control means 80 and the gate electrode DN, and controlled by the output potential detection means 70.

Thus, in this embodiment the output potential detection means 70 is used by both the shorting means 50D and the 20 setting means 22B. Then before data signals D and xD are output, under the control of the output potential detection means 70, the switch 64 is made conducting, and the switch 68 is made non-conducting, and with data input inhibited, the transistor 32 is operated, and the output terminal $D_{out}$ is set to an intermediate potential. It should be noted that the output drive means 30, the output potential detection means 70, the output control means 80, and so forth have the same configuration as in FIG. 6.

The switch 64 is connected between the output terminal $D_{out}$ and the gate electrode DN of the Nch transistor 32, and is constituted as a transmission gate comprising a Pch transistor 64a and Nch transistor 64b.

The switch 68 is connected between the gate electrode DN of the Nch transistor 32 which is the second control terminal of the output drive means 30 and the output control means 80, and is constituted as a transmission gate comprising a Pch transistor 68a and Nch transistor 68b.

The NAND gate 73 is controlled based on a preset control signal PSET. Specifically, when the preset control signal PSET is low, switch 68 is made conducting, and switch means 64 is made non-conducting, and when the preset control signal PSET is high, and moreover the potential of the output terminal $D_{out}$ level is higher than the logic level of the NAND gate 73, the switch 68 is made non-conducting, and the switch 64 is made conducting.

Next, the operation is described with reference to FIG. 11. FIG. 11 is a timing chart showing operating waveforms of the circuit of FIG. 10, and also shows current waveforms $I_{op}$ and $I_{on}$ of the output drive means 30. In particular, FIG. 11A shows the case where the output capacitance C is a large load capacitance of 100 pF or more, and FIG. 11B shows the case where $C_L$ is a small load capacitance of several picofarads.

(i) $C_L$=large load capacitance

A. When the output terminal $D_{out}$ potential goes from low to high

Figure 11A:
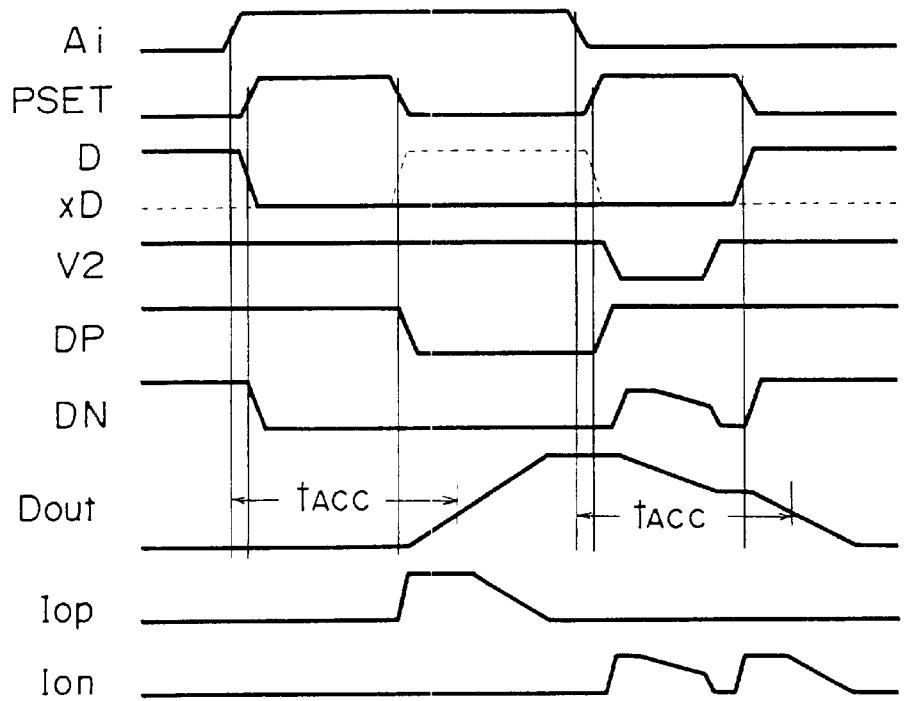
FIG. 11A is an operating waveform diagram of the output circuit of FIG. 10, in which the output capacitance is a large load capacitance.
Figure 11B:
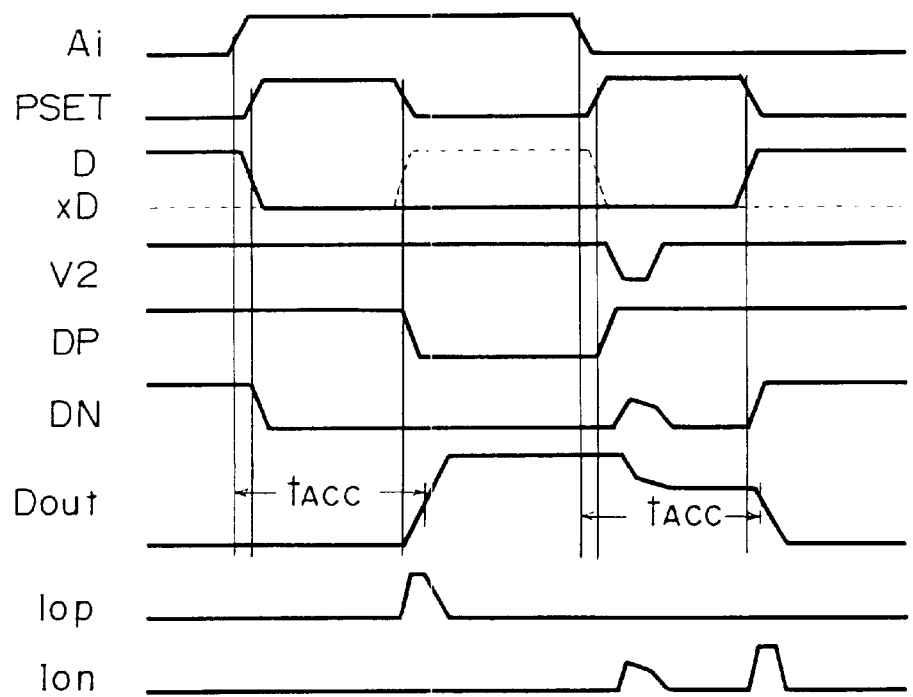
FIG. 11B is an operating waveform diagram of the output circuit of FIG. 10, in which the output capacitance is a small load capacitance.

In FIG. 11A, after a change in the address input Ai, with a rise in the internal data signal D the Nch transistor 32 goes off. Pch transistor 31 is also off (Step C1).

Next, after the output terminal $D_{out}$ has become high impedance, with a rise in the internal data signal xD for the new address, the Pch transistor 31 goes on, and the output terminal $D_{out}$ changes from ground potential to the power supply potential.

At this time, in the change from low to high, no preset operation is carried out, and the output terminal $D_{out}$ rises at a speed determined by the output load capacitance and the power of the Pch transistor 31 (Step C2).

B. When the output terminal $D_{out}$ potential goes from high to low

After a change in the address input Ai, in response to the internal data signal xD, the gate signals DP rise and the Pch transistor 31 goes off. The Nch transistor 32 is also off (Step D1).

Next, when the preset control signal PSET goes high, the output potential detection means 70 is activated, and the potential level of the output terminal $D_{out}$ is determined.

Since the output terminal $D_{out}$ is high, the output $V_2$ of the NAND gate 73 goes low, and switch 68 becomes non-conducting and switch 64 becomes conducting (Step D2).

The gate electrode DN of the Nch transistor 32 and the output terminal $D_{out}$ which is the drain electrode are shorted to be at the same potential, and the gate electrode DN goes approximately to the power supply potential, as determined by the capacitance ratio between the output terminal $D_{out}$ of 100 pF and the gate electrode DN of several picofarads.

Therefore, the Nch transistor 32 becomes conducting, and the output terminal $D_{out}$ begins to fall. Then since the output terminal $D_{out}$ and gate electrode DN are at the same potential, the potential of the gate electrode DN also falls together with the output terminal $D_{out}$ (Step D3).

With the fall in the potential of the output terminal $D_{out}$, the voltage between the gate and source falls, and therefore the power of the Nch transistor 32 is reduced, and the speed with which the output terminal $D_{out}$ falls is reduced. It should be noted that close to the threshold the current is small (Step D4).

When, eventually, the potential of the output terminal $D_{out}$ reaches the logic level of the NAND gate 73 of the output potential detection means 70 or below, or when the preset control signal PSET goes low, the output $V_2$ of the NAND gate 73 goes high, the switch 64 becomes non-conducting, and the switch 68 becomes conducting.

Therefore, the gate potential DN goes to ground potential by virtue of the Nch transistor of the inverter 83, the Nch transistor 32 goes off, and preset operation is stopped (Step D5).

During the presetting interval the internal data signal xD is fixed at low, and therefore the Pch transistor 31 does not conduct.

Thereafter, with a new address, the internal data signal D goes high, and once again the Nch transistor 32 goes on, and the output terminal $D_{out}$ falls (Step D6).

(ii) $C_L$=small load capacitance

B. When the output terminal $D_{out}$ potential goes from high to low

The case where the output terminal $D_{out}$ potential goes from high to low is the same as described above, and is therefore omitted here.

Next, in the case in which the output terminal $D_{out}$ has a small load capacitance, the operation in the case of a change in the address input Ai from high to low is described.

In the same way as in the above-mentioned steps D1 and D2, switch 68 becomes non-conducting, the switch 64 becomes conducting, and the gate electrode DN and the output terminal $D_{out}$ go to the same potential.

Since the output terminal $D_{out}$ terminal capacitance and gate electrode DN have approximately the same capacitance, the output terminal $D_{out}$ goes to an intermediate potential determined by the capacitance ratio of the output terminal $D_{out}$ and the gate electrode DN.

Thereafter, in the same way as in step D3, the Nch transistor 32 goes on, and therefore the output terminal $D_{out}$ falls.

In step D4, as the potential of the output terminal $D_{out}$ falls, the power of the Nch transistor 32 is reduced, and therefore as the potential becomes lower the rate of change of the output terminal $D_{out}$ potential is reduced.

In particular, when the potential of the output terminal $D_{out}$ is close to the threshold voltage of the Nch transistor 32, the power of the Nch output driver 32 is extremely reduced.

Therefore, when the output terminal $D_{out}$ is at the intermediate potential, the speed at which the output terminal $D_{out}$ falls is not faster than the operation speed of the output potential detection means 70.

For this reason, even when the preset control signal PSET is high, if the potential of the output terminal $D_{out}$ is at or less than the logic level of the NAND gate 73, the switch 64 becomes non-conducting, the switch 68 becomes conducting, the gate potential gate electrode DN is grounded by the inverter 83, the Nch transistor 32 goes off, and the presetting operation is stopped (Step D5).

Thereafter, in step D6 in the same way, the output terminal $D_{out}$ falls to the ground line potential.

The above fourth embodiment provides the following benefits.

(1) Since the output presetting operation is carried out by the existing data output transistors, special-purpose presetting transistors are not required to be provided, and a more compact semiconductor device can be achieved.

(2) In the output drive means 30, only one of the transistors operates to carry out the presetting, depending on the output potential, and therefore during presetting, no through current flows through the output drive means.

(3) The provision of a presetting circuit only for the Nch transistor which pulls the output down is particularly effective for a device operating from a 5 V supply. Specifically, in the 5 V TTL standard the output decision level is 1.5 V, and whereas a change in the output being a rise from 0 V to 1.5 V is determined as the signal going high, the output must fall 3.5 V from 5 V to 1.5 V to be recognized as going low. Therefore, for both the amount of current flowing during the output transition and the time of the output transition, a falling edge presents the greater problem.

Therefore, by providing a presetting operation only for an output falling transition, the access time, which is determined by the output fall time, can be made short, and additionally since the Nch transistor current $I_{on}$ is distributed into two events, the peak value of the current is reduced.

(4) The short-circuit state can be maintained regardless of the output control signal. In other words, the short-circuit state can be achieved by the first switch means, and at this time the second switch means is non-conducting, as a result of which the output control signals are not supplied, and thus control is not performed by the output control means, and the on state of the first or second transistor can be maintained. Also, in this interval power is supplied from the power supply line through the first transistor to the output terminal, and the potential is increased to set a predetermined potential, or alternatively a current flows out from the output terminal to the second transistor connected to the ground line, causing the potential to fall, and establishing the predetermined potential.

(5) Additionally, during presetting, since the second switch means is non-conducting, no current flows from the output terminal through the second switch means to the internal circuit, and noise can be reduced.

Fifth Embodiment

Figure 12:
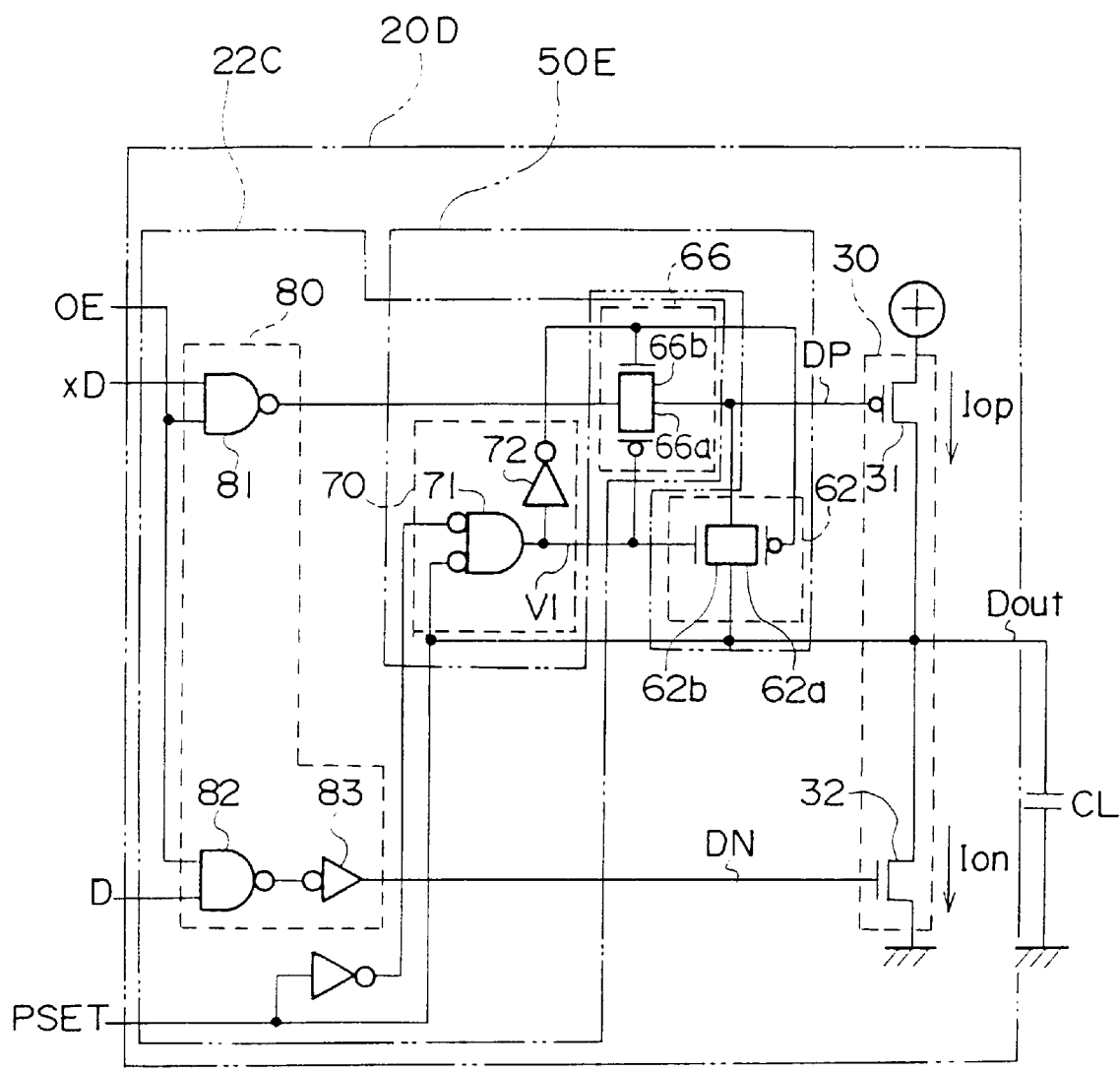
FIG. 12 is a circuit diagram of a fifth embodiment of the output circuit according to the present invention.
Figure 13A:
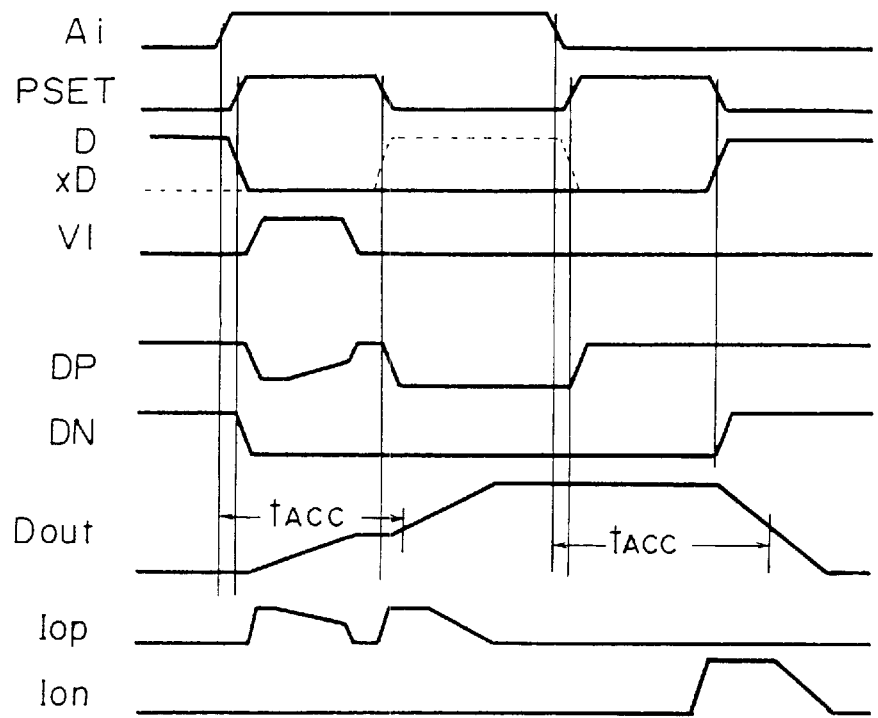
FIG. 13A is an operating waveform diagram of the output circuit of FIG. 12, in which the output capacitance is a large load capacitance.
Figure 13B:
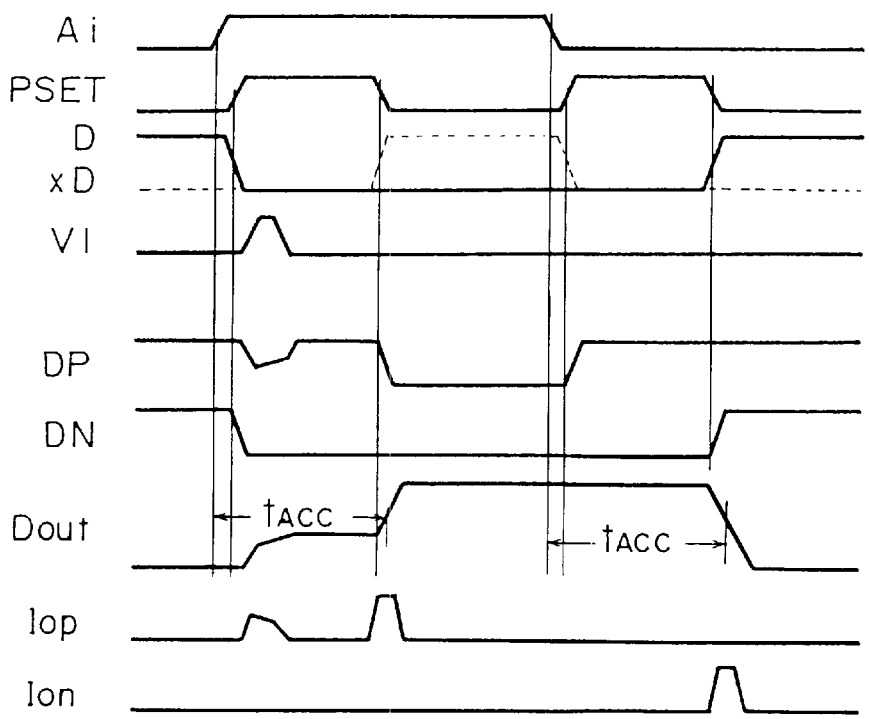
FIG. 13B is an operating waveform diagram of the output circuit of FIG. 12, in which the output capacitance is a small load capacitance.

Next, a fifth embodiment of the present invention is described with reference to FIGS. 12 and 13. This embodiment is the reverse of the fourth embodiment, providing a Pch transistor only, for the case only that the output terminal $D_{out}$ goes from low to high. Therefore, since configuration, benefits and so forth are similar to those of the fourth embodiment, detailed description is omitted here.

Sixth Embodiment

Figure 14:
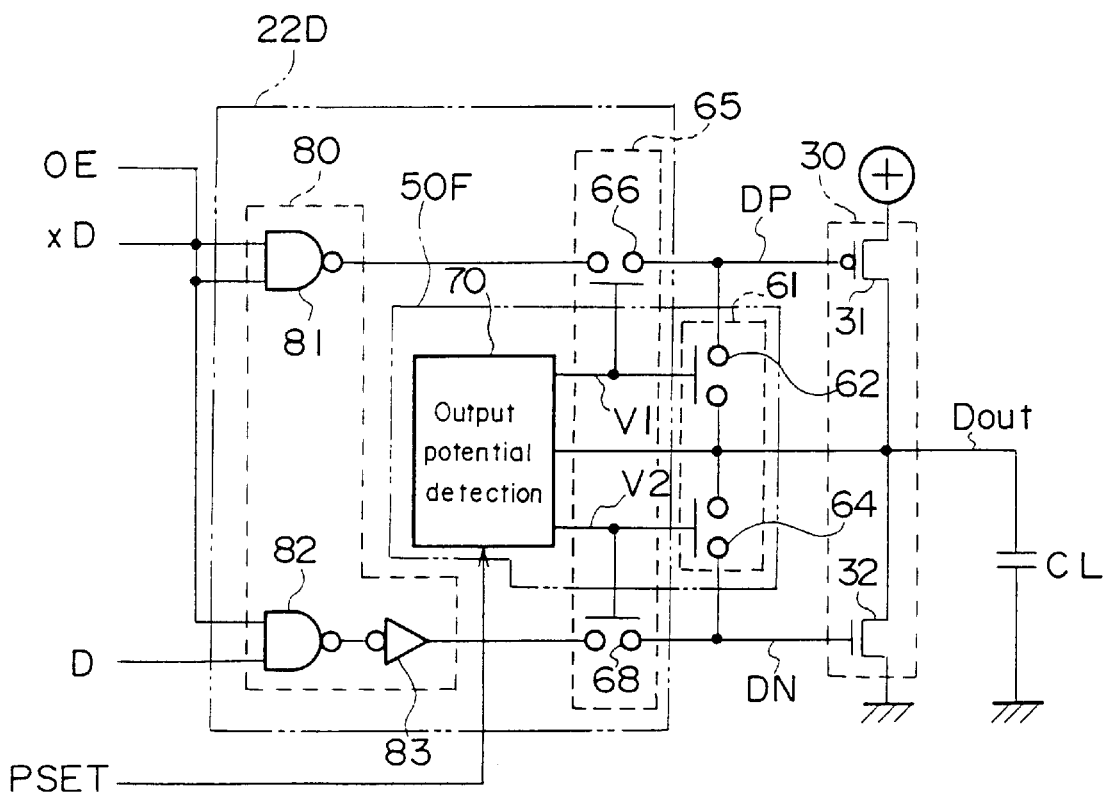
FIG. 14 is a schematic circuit diagram of a sixth embodiment of the output circuit according to the present invention.

Next, a sixth embodiment of the present invention is described with reference to FIGS. 14, 15, and 16. FIG. 14 is a circuit diagram of an output circuit showing schematically the sixth embodiment of the present invention.

In FIG. 14, the output circuit comprises a shorting means 50F, and a setting means 22D.

The shorting means 50F comprises a first switch means 61 connected between the output terminal $D_{out}$ and the gate electrode DP and gate electrode DN which are the first and second control terminals of the first and second transistors 31 and 32 of the output drive means 30. Further, shorting means 50F comprises an output potential detection means 70 which detects the potential of the output terminal $D_{out}$, and based on the detected output potential controls the first switch means 61.

The setting means 22D comprises the output potential detection means 70 and an output control means 80 which by inputting output control signals to control terminal gate electrode DP and gate electrode DN of the first and second transistors 31 and 32, controls transistors 31 and 32. Further, setting means 22D comprises a second switch means 65, connected between the output control means 80 and the control terminal gate electrode DP and gate electrode DN, and controlled by the output potential detection means 70.

It should be noted that as the first switch means 61 are used first and second switches 62 and 64, and as the second switch means 65 are used third and fourth switches 66 and 68.

The first switch 62 is connected between the output terminal $D_{out}$ and the gate electrode DP of the Pch transistor 31. The second switch 64 is connected between the output terminal $D_{out}$ and the gate electrode DN of the Nch transistor 32.

The third switch 66 is connected between the gate electrode DP of the Pch transistor 31 and the output control means 80. The fourth switch 68 is connected between the gate electrode DN of the Nch transistor 32 and the output control means 80.

The output potential detection means 70 controls the first to fourth switches 62, 64, 66, and 68 by means of the preset control signal PSET and the potential of the output terminal $D_{out}$.

Thus in this embodiment, the output potential detection means 70 is used in common by the shorting means 50F and setting means 22D. Moreover, before the data signals D and xD are output, either of the upper and lower switches 62 and 64 of the first switch means 61 is made conducting, and either of the upper and lower switches 66 and 68 of the second switch means 65 is made non-conducting by the output potential detection means 70, and in the data input inhibited state, one of the transistors 3 and 32 is operated, to set the output terminal $D_{out}$ to an intermediate potential. It should be noted that the output drive means 30, the output potential detection means 70, the output control means 80 and so forth have the same configuration as in FIG. 2.

Figure 15:
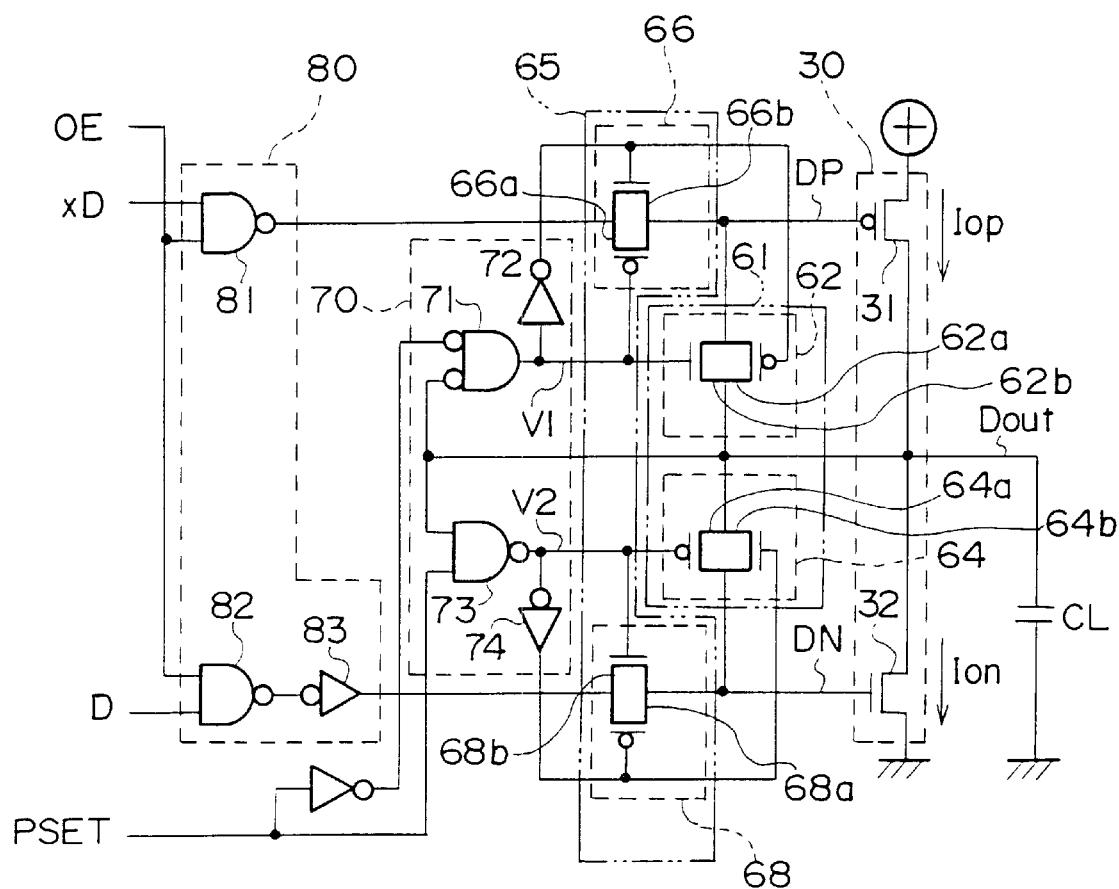
FIG. 15 is a circuit diagram showing details of the output circuit of FIG. 14.

FIG. 15 is a circuit diagram of the output circuit showing the sixth embodiment of the present invention; the switches 62, 64, 66, and 68 in the circuit in FIG. 14 are constituted by Pch transistors (62a, 64a, 66a, and 68a) and Nch transistors (62b, 64b, 66b, and 68b) as transmission gates, and the output potential detection means 70 has the same configuration as the output potential detection means 70 in the circuit diagram shown in FIG. 2.

In FIG. 15, the NOR gate 71 and NAND 73 are controlled by the preset control signal PSET, and when the preset control signal PSET is low, switches 62 and 64 are non-conducting, switches 66 and 68 are conducting, and the output drive means 30 is under the control of the output control means 80.

When the preset control signal PSET is high, control according to the potential level of the output terminal $D_{out}$ is performed: when the output terminal $D_{out}$ is high, the third and second switches 66 and 64 become conducting, and the first and fourth switches 62 and 68 become non-conducting, and when the output terminal $D_{out}$ is low, these conducting and non-conducting states are reversed.

Figure 16A:
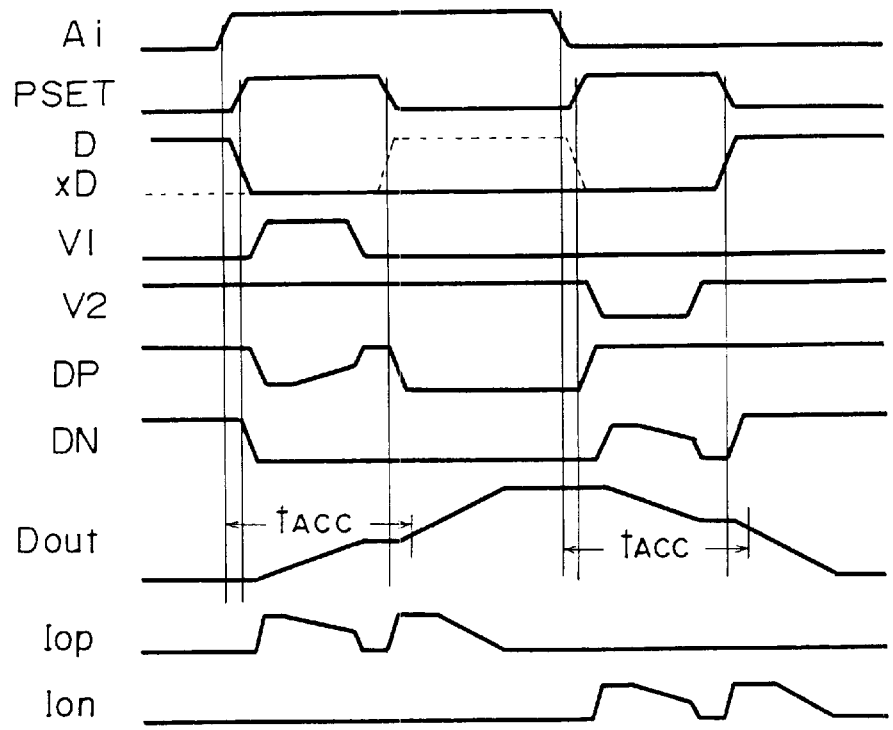
FIG. 16A is an operating waveform diagram of the output circuit of FIG. 15, in which the output capacitance is a large load capacitance.
Figure 16B:
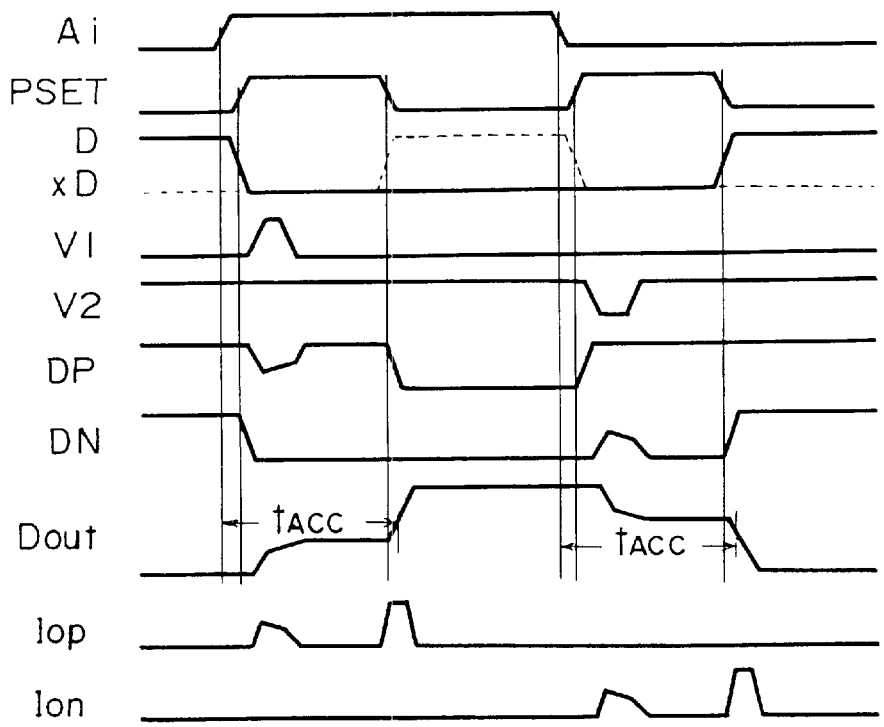
FIG. 16B is an operating waveform diagram of the output circuit of FIG. 15, in which the output capacitance is a small load capacitance.

Next, operation is described with reference to FIG. 16. FIG. 16 is a timing chart showing operating waveforms of the circuit of FIG. 15, and also shows current waveforms $I_{op}$ and $I_{on}$ of the output drive means. In particular, FIG. 16A shows the operating waveforms in the case where the output capacitance $C_L$ is a large load capacitance of 100 pF or more, and FIG. 16B in the case where $C_L$ is a small load capacitance of several picofarads.

(i) $C_L$=large load capacitance
A. When the output terminal $D_{out}$ potential goes from low to high In FIG. 16, the operation in which the output terminal $D_{out}$ to which an output capacitance of around 100 pF is connected goes from low to high is as follows.

After a change in the address input Ai, in response to an internal data signal D, the gate signals of the gate electrode DN falls, and the Nch transistor 32 goes off.

When the preset control signal PSET goes high, the output potential detection means 70 is activated, and the potential of the output terminal $D_{out}$ level is determined.

Moreover, since the output terminal $D_{out}$ is low, the output $V_1$ of the NOR gate 71 goes from low to high, the third switch 66 becomes non-conducting, and the first switch 62 becomes conducting.

At this time, since the output $V_2$ of the NAND gate 73 remains low, the fourth switch 68 is conducting, and the second switch 64 is non-conducting.

The gate electrode DP of the Pch transistor 31 and the output terminal $D_{out}$ are shorted, and at the same potential, and by virtue of the capacitance ratio of 100 pF for the output terminal $D_{out}$ to several picofarads for the gate electrode DP, the gate electrode DP is substantially at 0 V.

Therefore, the Pch transistor 31 goes on, the output terminal $D_{out}$ begins to rise, and by virtue of the first switch 62, since the output terminal $D_{out}$ and the gate electrode DP are at the same potential, the gate electrode DP potential also rises together with the output terminal $D_{out}$.

In accordance with this, since the voltage between the gate and source of the Pch transistor 31 falls, the power is reduced, and the speed with which the output terminal $D_{out}$ rises is reduced.

When, eventually, the potential of the output terminal $D_{out}$ reaches the logic level of the NOR gate 71 of the output potential detection means 70 or more, or when the preset control signal PSET goes low, the first switch 62 becomes non-conducting, the third switch 66 becomes conducting, by virtue of the Pch transistor of the NAND 81 the gate electrode DP goes to the power supply potential, and the Pch transistor 31 stops the presetting operation, and goes off.

If the logic level of the NAND gate 73 is previously set higher than the logic level of the NOR gate 71, during the above-mentioned presetting interval the fourth switch 68 remains conducting, and the Nch transistor 32 does not turn on.

Thereafter, with a new address Ai, the internal data signal xD goes high, once again the Pch transistor 31 goes on, and the output terminal $D_{out}$ rises to the power supply potential. At this time, since the output terminal $D_{out}$ and gate electrode DP are not shorted, the normal operation is carried out.

B. When the output terminal $D_{out}$ potential goes from high to low

Contrariwise, when the output terminal $D_{out}$ potential goes from high to low, the second switch 64 becomes conducting, and by virtue of the Nch transistor 32 an intermediate potential is preset. Thereafter, by virtue of the Nch transistor 32, it is pulled down to ground line potential.

(ii) $C_L$=small load capacitance
A. When the output terminal $D_{out}$ potential goes from low to high Next, the operation is described in the case that no load capacitance is connected to the output terminal $D_{out}$, and the address input changes from low to high.

In the same way as in the operation described above, the first switch 62 becomes conducting, the second switch 64 remains non-conducting, and the gate electrode DP and output terminal $D_{out}$ go to the same potential. Here, since the output terminal $D_{out}$ (in this case the terminal capacitance only) and the gate electrode DP have approximately the same capacitance, and therefore the output terminal $D_{out}$ and the gate electrode DP go to an intermediate potential determined by the capacitance ratio.

Since Pch transistor 31 is on, the output terminal $D_{out}$ rises, but since as described above the power of the Pch transistor 31 is reduced as the potential of the output terminal $D_{out}$ rises, the higher the potential becomes the more the rate of change of the potential of the output terminal $D_{out}$ is reduced.

In particular, when the potential difference between the power supply voltage $V_{DD}$ and output terminal $D_{out}$ is Pch transistor 31 close to the threshold voltage the power of the Pch transistor 31 is extremely reduced.

Moreover, when the output terminal $D_{out}$ is at the intermediate potential, the speed with which the output terminal $D_{out}$ rises does not exceed the operation speed of the output potential detection means 70.

Therefore, even if the preset control signal PSET is high, if the potential of the output terminal $D_{out}$ is at least at the logic level of the NOR gate 71, the first switch 62 becomes non-conducting, the gate potential DP goes to the power supply potential, and with the output terminal $D_{out}$ at the intermediate potential the Pch transistor 31 stops the presetting operation.

Thereafter, the internal data signal xD goes high, and once again by virtue of the Pch transistor 31 the output terminal $D_{out}$ goes to the power supply potential.

B. When the output terminal $D_{out}$ potential goes from high to low

When the output terminal $D_{out}$ potential goes from high to low, the second switch 64 becomes conducting, by virtue of the Nch transistor 32 an intermediate potential is preset, and thereafter once again the Nch transistor 32 operates, and is pulled down to the ground line potential.

The above sixth embodiment provides the following benefits.

(1) Of the two transistors connected to the power supply line and ground line and comprising the output drive means, since only the transistor of opposite potential to the output potential operates to carry out presetting, during presetting, no through current flows in the output drive means.

(2) Providing a presetting circuit for each of the Nch and Pch transistors is particularly effective for low voltage semiconductor devices operating on a 3 V supply, for example.

In the LVTTL standard for a power supply voltage of 3.3 V, the output decision level is 1.5 V, and both an output decision (change from 0 V to 1.5 V) and an output falling edge decision (change from 3.3 V to 1.5 V) correspond to the same level of voltage change.

The potential setting for not just one of rising and falling edges, but for both, is only possible with the present invention. Therefore, a double preset is possible, both a preset when the output goes from low to high, and a preset when the output goes from high to low, the output transition time is reduced both when the output rises and when it falls, and even faster access is made possible, and this is effective for a low voltage drive device.

Again, the output current magnitude in an output transition, and the output transition time is approximately the same both for an output rising edge and falling edge. By carrying out presetting both for an output rising edge and falling edge, output transition access times in both directions are reduced, and additionally since both of the output driver currents $I_{op}$ and $I_{on}$ are distributed into two events, the peak values of the currents are reduced.

(3) By providing the presetting circuit of the present invention on both the power supply line and ground line sides, high speed access can be achieved even using a voltage as low as 3 V.

(4) Additionally, by controlling the on and off operation of the first and second transistors by the output control means, for example when the output terminal is low, the output terminal potential is raised to a predetermined potential, and the first transistor is turned off, but at that point if the current supply is stopped, the first switch means is put in the off state and the first transistor is turned on, the rise from the above predetermined potential to the power supply potential can easily be achieved.

Contrariwise, when for example the output terminal is high, the output terminal potential is lowered to a predetermined potential, and the second transistor is turned off, but at that point if the current supply is stopped, the first switch means is put in the off state and the second transistor is turned on, the fall from the above predetermined potential to the ground potential can easily be achieved. In this way, by combined control of the switch means or the like, an optimum device can be obtained.

Seventh Embodiment

Next, a seventh embodiment of the present invention is described with reference to FIGS. 16 and 17. The difference between this embodiment and the above-mentioned sixth embodiment is a difference in the first to fourth switches 62, 64, 66, and 68, and in the output control means 80.

Figure 17:
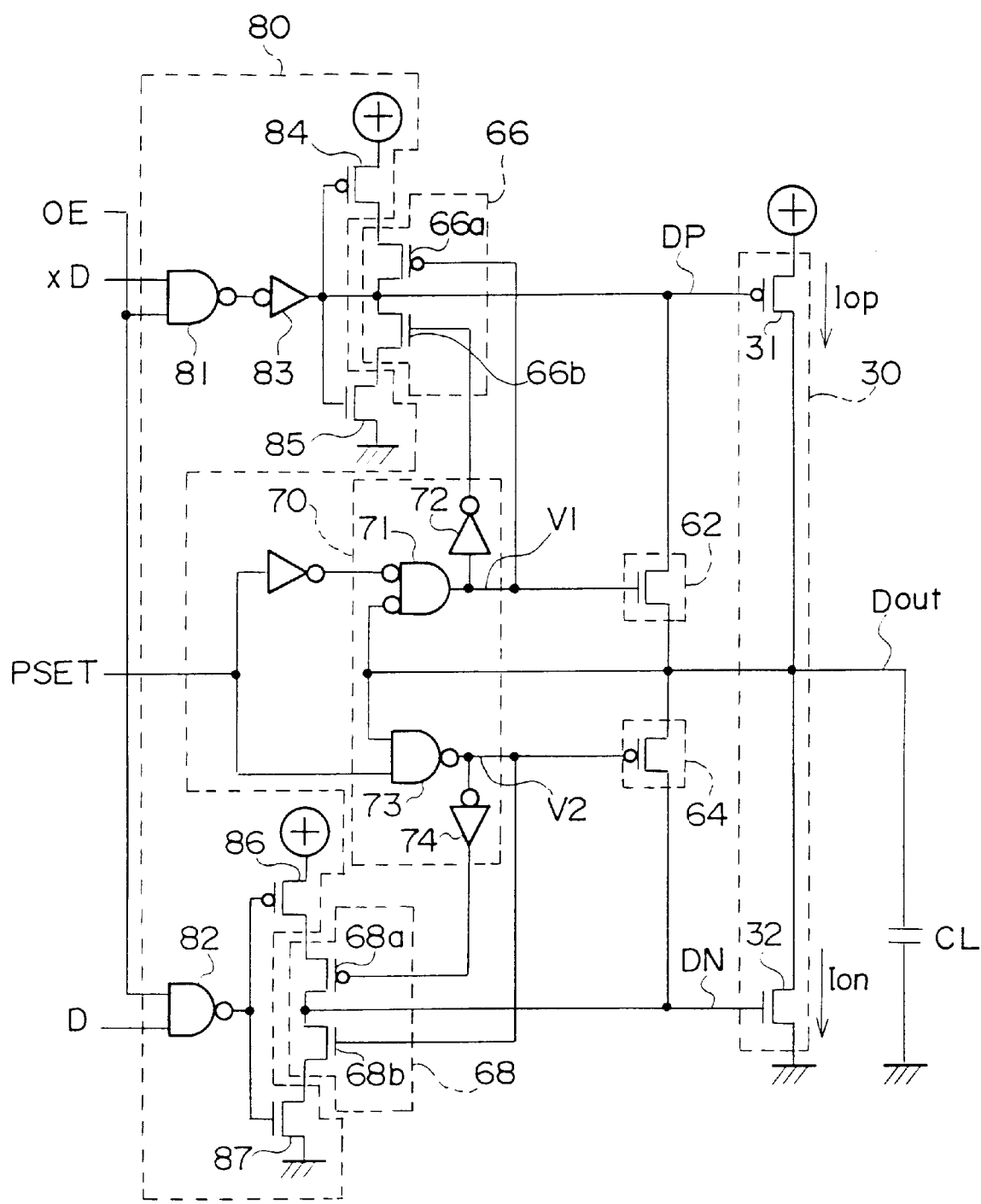
FIG. 17 is a circuit diagram of a seventh embodiment of the output circuit according to the present invention.

In FIG. 17, the first switch 62 is connected between the output terminal $D_{out}$ and the gate electrode of the Pch transistor 31, and uses an Nch transistor, of opposite conductivity type to the Pch transistor 31.

The second switch 64 is connected between the output terminal $D_{out}$ and the gate electrode of the Nch transistor 32, and uses a Pch transistor, of opposite conductivity type to the Nch transistor 32.

The third switch 66 is connected between the control terminal gate electrode DP of the Pch transistor 31 and the output control means 80. The fourth switch 68 is connected between the gate electrode DN being the second control terminal of the Nch transistor 32 and the output control means 80.

The output control means 80 comprises a NAND 82 and transistors 86 and 87 which control the Nch transistor 32 in accordance with the internal data signal D and output control signals OE. And it comprises a NAND 81, inverter 83, and transistors 84 and 85 which control the Pch transistor 31 in accordance with the internal data signal xD and output control signals OE.

The output potential detection means 70 is the same as in FIG. 15, and the control operation of the first to fourth switches 62, 64, 66, and 68 according to the preset control signal PSET and the potential of the output terminal $D_{out}$ level is also the same as in FIG. 15.

The transistors 84 and 85 form together with the third switch 66 a clocked inverter. The transistors 86 and 87 form together with the fourth switch means 68 a clocked inverter.

In FIG. 17 the clocked inverter including the NAND 81, the inverter 83, and the third switch 66 is equivalent to the NAND 81 and third switch 66 in the circuit of FIG. 15. In FIG. 17 the clocked inverter including the NAND 82 and the fourth switch 68 is equivalent to the NAND 82, the inverter 83, and the fourth switch 68 in the circuit of FIG. 15.

Therefore, the circuit operation of the seventh embodiment shown in FIG. 17 is basically the same as the operation of the circuit shown in FIG. 15 and only the points of difference are described.

In FIG. 17, for the presetting operation in the case that the output terminal $D_{out}$ goes from low to high, immediately after the beginning of presetting, the source electrode (output terminal $D_{out}$) of the Nch transistor 62 which is the first switch 62 is at 0 V, the gate electrode (output $V_1$ of NOR 71) is at the power supply voltage, and the drain electrode (gate electrode DP) is at the power supply voltage. For this reason, the Nch transistor 62 is not modulated by the threshold value back gate effect, and since the power is not reduced, is adequately conducting.

During the presetting operation, the even after the gate electrode DP and output terminal $D_{out}$ are shorted, while the output terminal $D_{out}$ is in the low potential state, the back gate effect on the Nch transistor 32 is small Additionally, the voltage between the gate and source is also large. For this reason, the operation of the Nch transistor 32 is not restricted, and it is conducting.

Again, with the output terminal $D_{out}$ at the intermediate potential, the threshold voltage of the Nch transistor 62 is modulated by the back gate effect, and its degree of conducting is restricted. Therefore, the voltage of the gate electrode DP does not rise above the power supply voltage reduced by a threshold voltage including the back gate effect of the Nch transistor 62. However, since the output terminal $D_{out}$ is at the intermediate potential, a presetting operation is not required.

Moreover, since the voltage between the gate and source of the Pch output driver 31 voltage is also reduced, the power is low, and no excessive output drive occurs. This is so whether the load capacitance is 100 pF or a small load capacitance, and independent of the size of the load capacitance, the presetting operation is carried out in the same way as in the circuit of FIG. 15, and the operating waveforms of the FIG. 17 circuit are the same as shown in the timing chart of FIG. 16.

The above seventh embodiment provides the following benefits.

(1) As in FIG. 17, since the first switch is an Nch transistor of opposite conductivity type to the Pch transistor, and the second switch is a Pch transistor of opposite conductivity type to the Nch transistor, the first and second switches can be implemented by a single transistor, the signal lines controlling the switch means can be just two lines, and the circuit scale and layout scale can be simplified.

By forming the output drive means and output terminal shorting switch as transistors, the number of circuit elements is reduced, the circuit scale and layout area can be simplified, and the device can be made more compact.

(2) The basic operation of the seventh embodiment of the present invention is the same as the sixth embodiment; during presetting no through current flows in the output drive means, and the peak value of the current flowing in the output drive means is reduced.

(3) Again, even under high load conditions the output terminal is set to the intermediate potential at high speed, and under conditions with no load, output oscillation does not occur, and special-purpose preset transistor provision is not required.

(4) Further, whether the output is rising or falling, in both cases the output transition time is short, and even with low voltage operation or with a semiconductor device the access times are made shorter.

Eighth Embodiment

Next, an eighth embodiment of the present invention is described with reference to FIGS. 16 and FIG. 18. The difference between this embodiment and the above-mentioned sixth embodiment is a difference in the third and fourth switches 66 and 68.

Figure 7A:
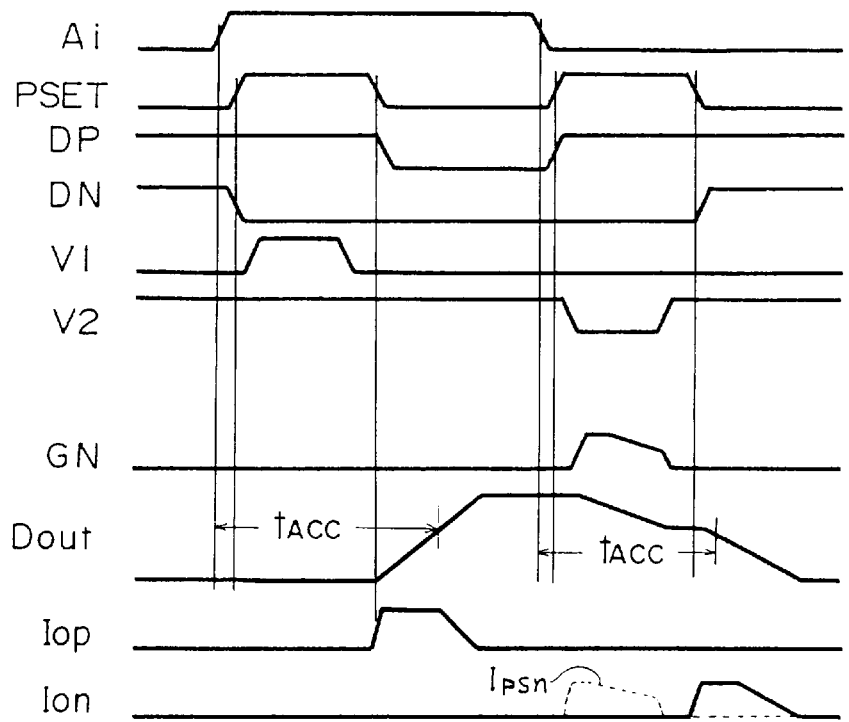
FIG. 7A is an operating waveform diagram of the output circuit of FIG. 6, in which the output capacitance is a large load capacitance.
Figure 7B:
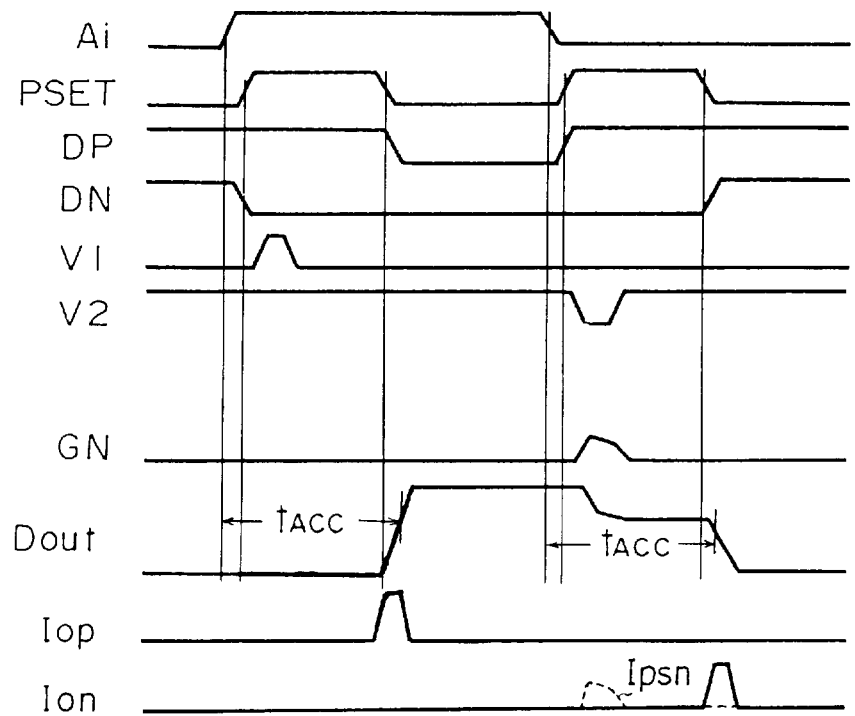
FIG. 7B is an operating waveform diagram of the output circuit of FIG. 6, in which the output capacitance is a small load capacitance.
Figure 18:
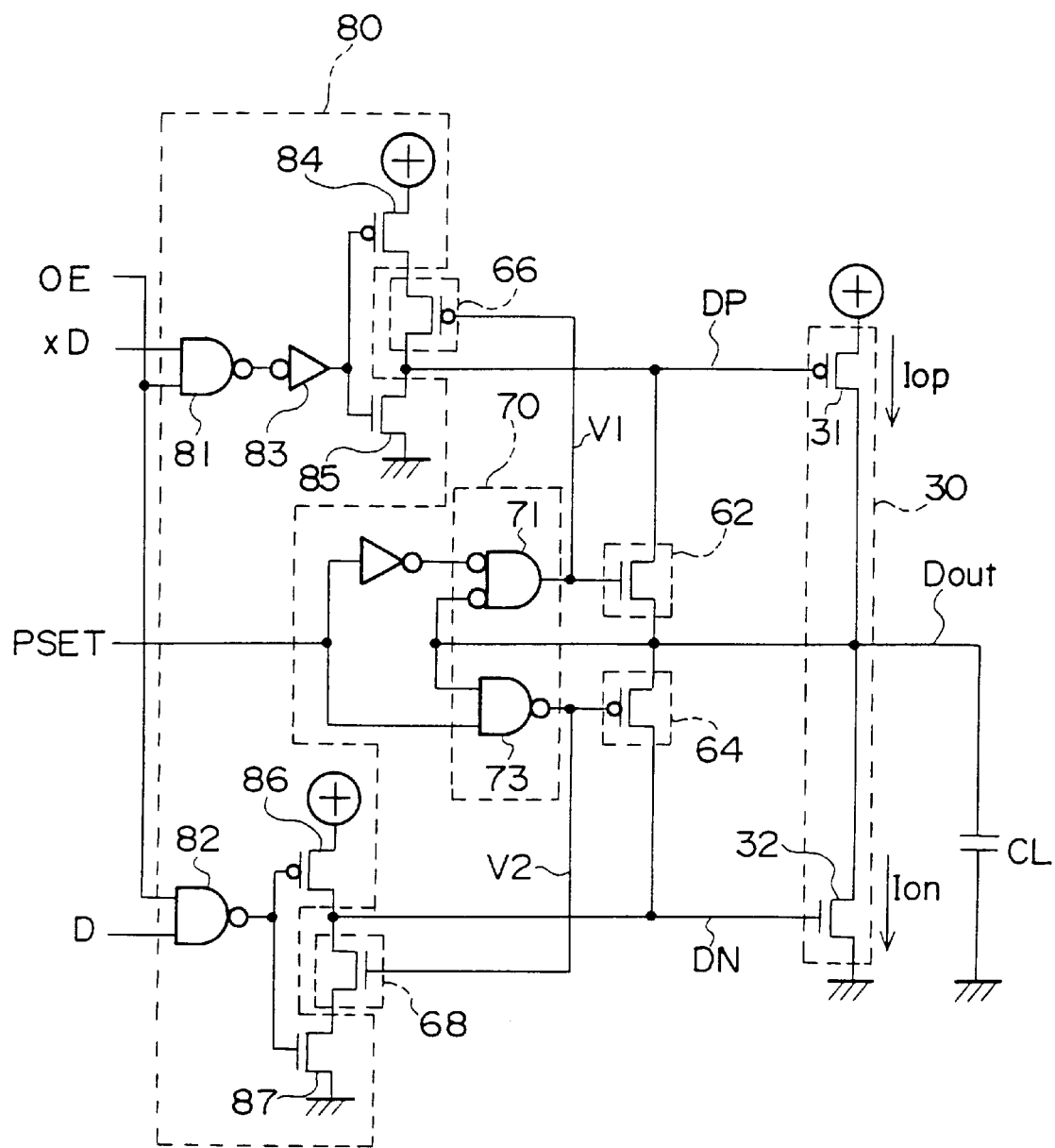
FIG. 18 is a circuit diagram of an eighth embodiment of the output circuit according to the present invention.

The circuit in FIG. 18 eliminates the Nch transistor 66b of the third switch 66 and the Pch transistor 68a of the fourth switch 68 from the circuit of FIG. 17, and also eliminates the inverters 72 and 74 from the output potential detection means 70, but otherwise is the same circuit configuration as in FIG. 7.

Therefore, in the circuit of FIG. 18 during the presetting operation the operation of the output potential detection means 70, the first to fourth switches 62, 64, 66, and 68 operation and the output drive means 30 is the same as in the circuit of FIG. 17, and the operating waveforms of FIG. 18 are the same as shown in the timing chart of FIG. 16.

In FIG. 18, at the preset start time, for example, when the output terminal $D_{out}$ is high, the output $V_2$ of the NAND 73 is low, and the fourth switch 68 becomes non-conducting. The internal data signal D goes low, and the Pch transistor 86 becomes non-conducting.

Therefore, without preventing the operation of the second switch 64, no current flows into the internal circuit through the second switch means 64.

At the same time, the output $V_1$ of the NOR 71 is low, the first switch 66 is conducting, and the Pch transistor 84 also is conducting by virtue of the internal data signal xD being low, and therefore the gate electrode DP goes high, and during the presetting interval the Pch transistor 31 does not go on.

Ninth Embodiment

Figure 19:
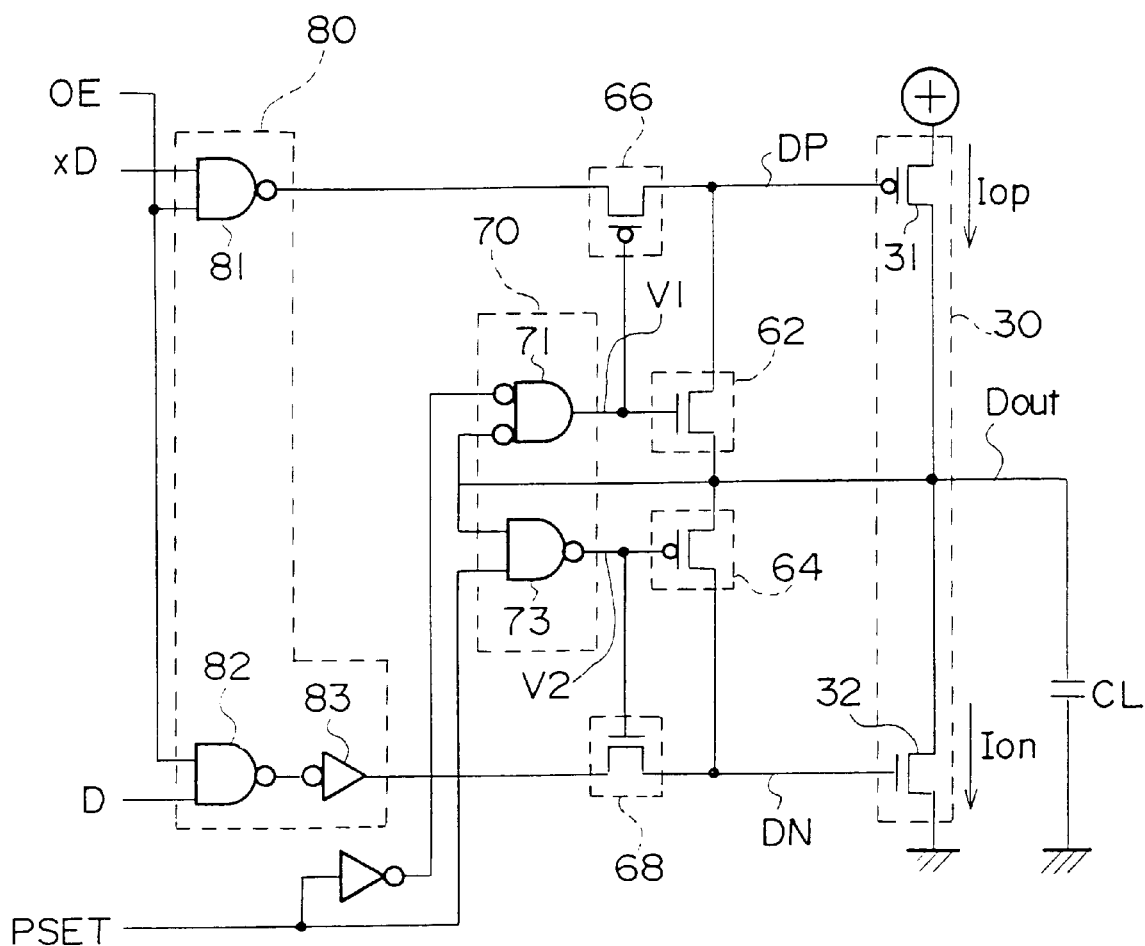
FIG. 19 is a circuit diagram of a ninth embodiment of the output circuit according to the present invention.

Next, a ninth embodiment of the present invention is described with reference to FIGS. 19 and 20. FIG. 19 is a circuit diagram showing a ninth embodiment of the output circuit of the present invention.

FIG. 19 differs from the circuit of FIG. 18 in that the Pch transistor 66 of the third switch 66 and the Nch transistor 68 of the fourth switch 68 are connected in series to the control terminal of the output drive means 30 and the output of the output control means 80, and the output control means 80 comprises NANDs 81 and 82 and inverter 83.

Otherwise the configuration of this circuit is the same as in FIG. 18, and during presetting operation the basic operation of the output potential detection means 70, first to fourth switches 62, 64, 66, and 68 and the output drive means 30 is the same as in FIG. 18 circuit.

Figure 20A:
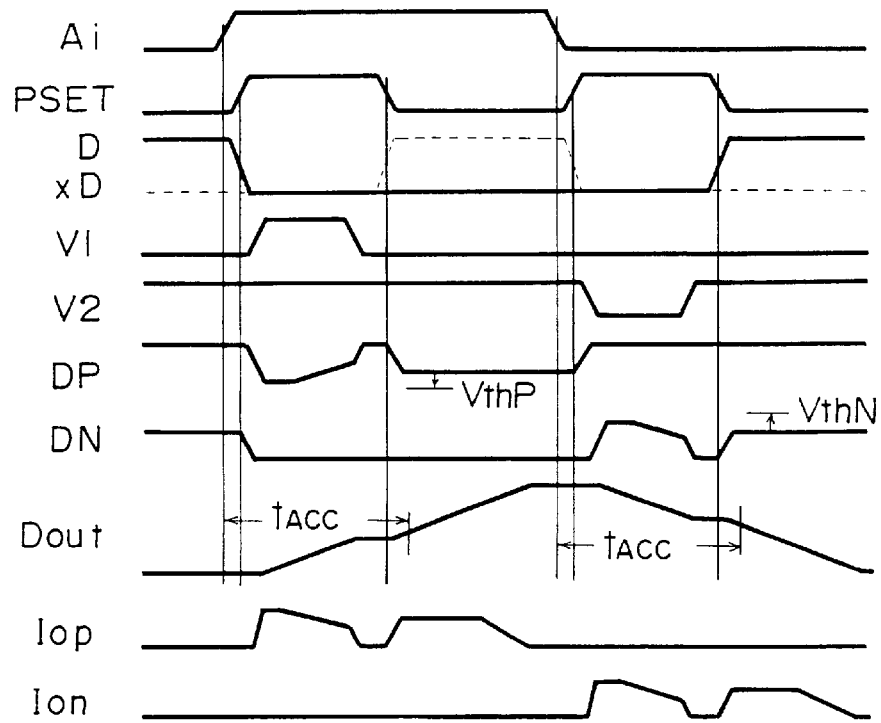
FIG. 20A is an operating waveform diagram of the output circuit of FIG. 19, in which the output capacitance is a large load capacitance.
Figure 20B:
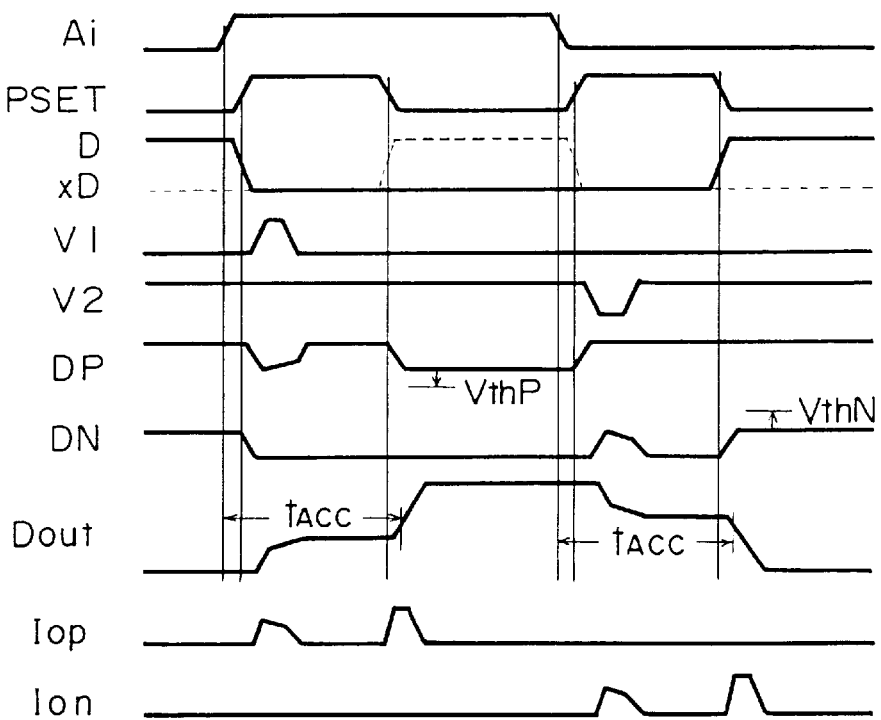
FIG. 20B is an operating waveform diagram of the output circuit of FIG. 19, in which the output capacitance is a small load capacitance.

FIG. 20 is a timing chart showing operating waveforms of the circuit shown in FIG. 19, and also shows current waveforms $I_{op}$ and $I_{on}$ of the output drive means. FIG. 20A shows the operating waveforms in the case where the output capacitance $C_L$ is a large load capacitance of 100 pF or more, and FIG. 20B in the case where $C_L$ is a small load capacitance.

The difference in the operation of the circuit in FIG. 19 and the circuit in FIG. 18 is in the gate potentials of the output drive means after presetting.

As shown in the timing chart of FIG. 20, for example when the Nch transistor 32 is outputting data, the gate potential does not rise to the power supply voltage, and the potential is reduced by the threshold voltage $V_{thn}$ of the Nch transistor 68.

Similarly the gate potential of the Pch transistor 31 is restricted by the threshold voltage of the third switch 66. At this time, by making the size of the transistors 31 and 32 appropriate to provide the desired power, it is possible to avoid any effect on accessing.

During the presetting interval, for example when the output terminal $D_{out}$ is high, the output $V_1$ of the NOR 71 is low, and the switch means 66 is conducting, the internal data signal xD is low, and the output of the NAND 81 is high, and therefore the gate electrode DP goes high, and during the presetting interval the Pch transistor 31 does not go on.

The above ninth embodiment as shown in FIG. 19 and eighth embodiment as shown in FIG. 18 provide the following benefits.

(1) By providing the third switch and the first transistor of the output drive means as a Pch transistor, the first switch as an Nch transistor of opposite conductivity type, the fourth switch and the second transistor of the output drive means as an Nch transistor, and the second switch as a Pch transistor of opposite conductivity type, each of the switches can be constituted by a single transistor. For this reason, the switch control signals can be constituted by two lines for each output, and the switches, signal lines controlling the switches, and the output potential detection means are simplified, and even more so than in the seventh embodiment, the circuit scale of the presetting circuit and the layout area can be reduced, and the device can be made more compact.

(2) In particular, for devices with 8-bit, 16-bit, 32-bit, and other multiple output terminals, a large chip size reduction can be achieved. Again, the basic operation of the eighth and ninth embodiments is the same as that of the seventh embodiment, and during presetting no through current flows in the output drive means, and the peak value of the current flowing in the output drive means is reduced.

(3) Again, even under high load conditions the output terminal is set to the intermediate potential at high speed, and under conditions with no load, output oscillation does not occur, and special-purpose preset transistor provision is not required.

(4) Further, whether the output is rising or falling, in both cases the output transition time is short, and even with low voltage operation or with a semiconductor device the access times are made shorter.

Tenth Embodiment

Figure 21:
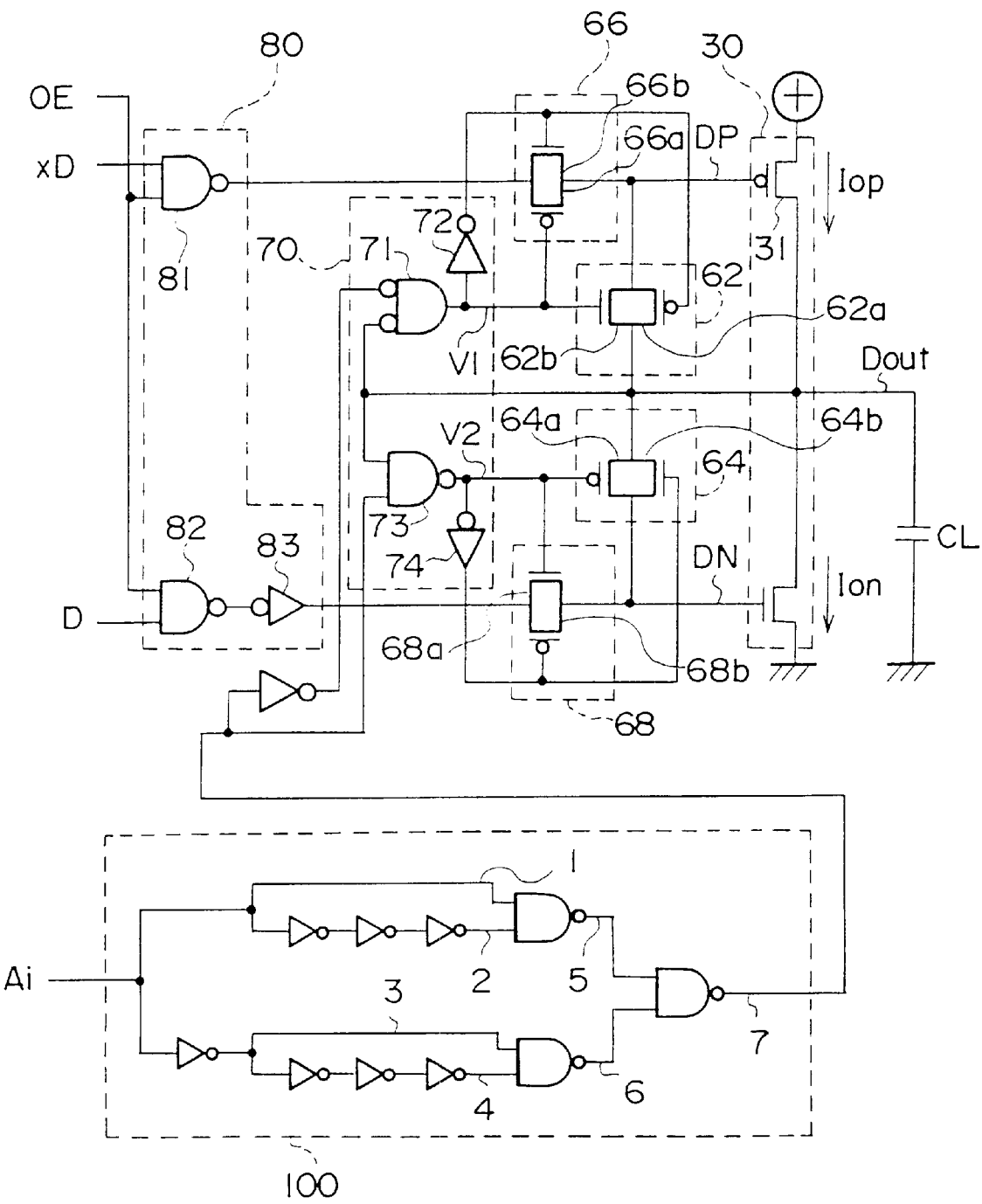
FIG. 21 is a circuit diagram of a tenth embodiment of the output circuit according to the present invention.
Figure 22A:
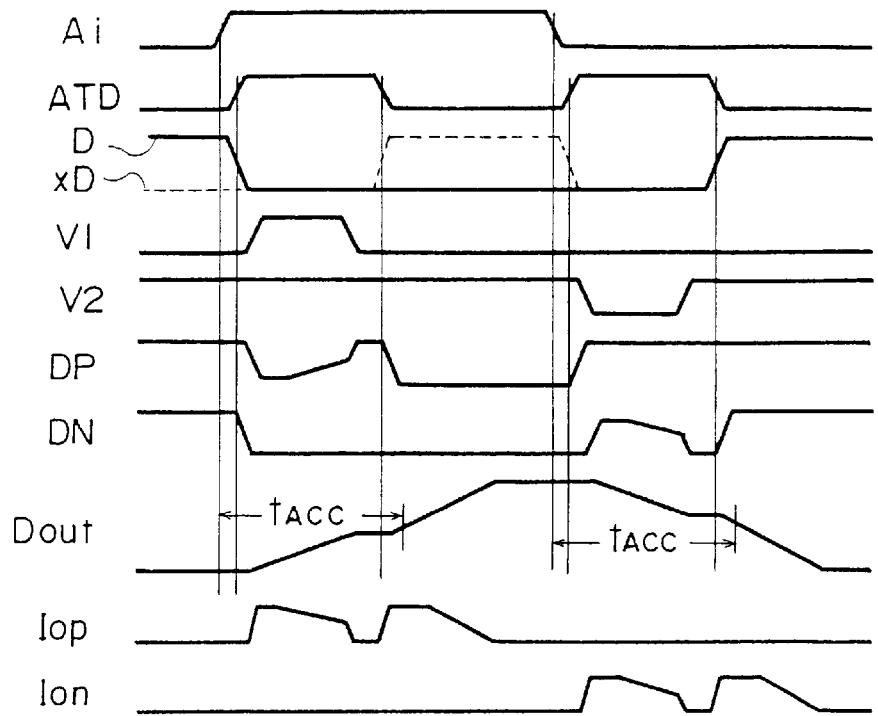
FIG. 22A is an operating waveform diagram of the output circuit of FIG. 21, in which the output capacitance is a large load capacitance.
Figure 22B:
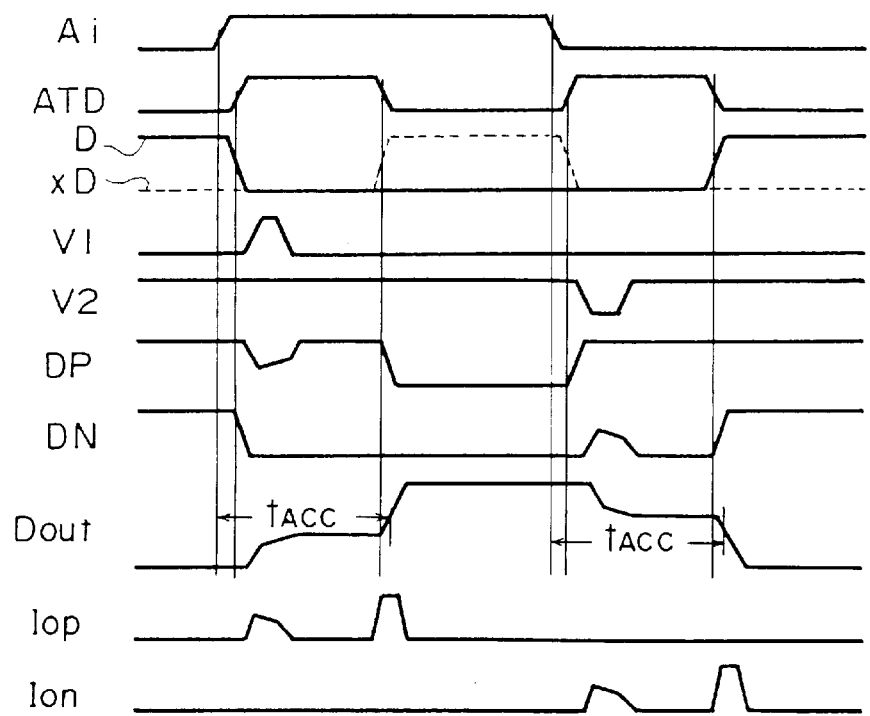
FIG. 22B is an operating waveform diagram of the output circuit of FIG. 21, in which the output capacitance is a small load capacitance.
Figure 23A:
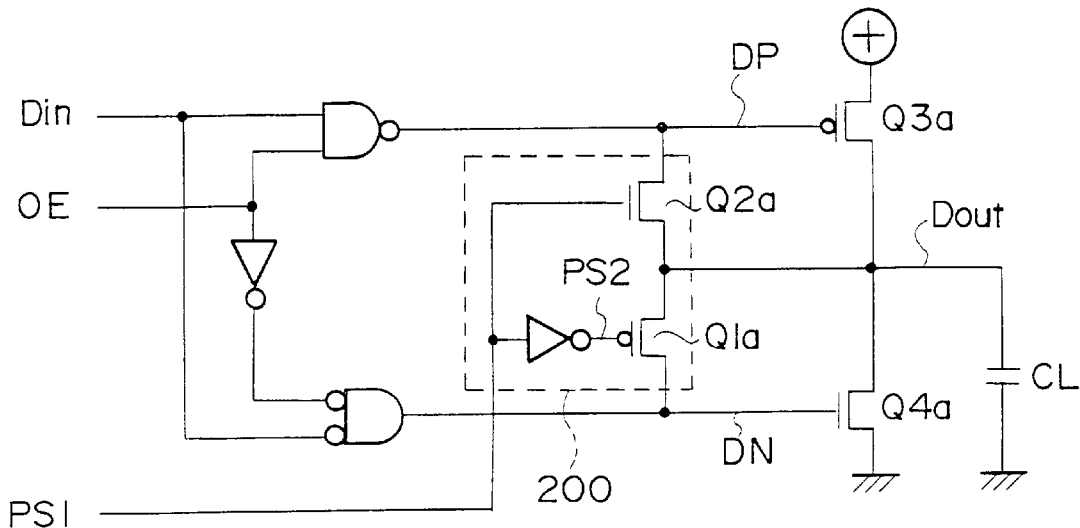
FIG. 23A is a circuit diagram showing the semiconductor device output circuit of prior art 1.
Figure 23B:
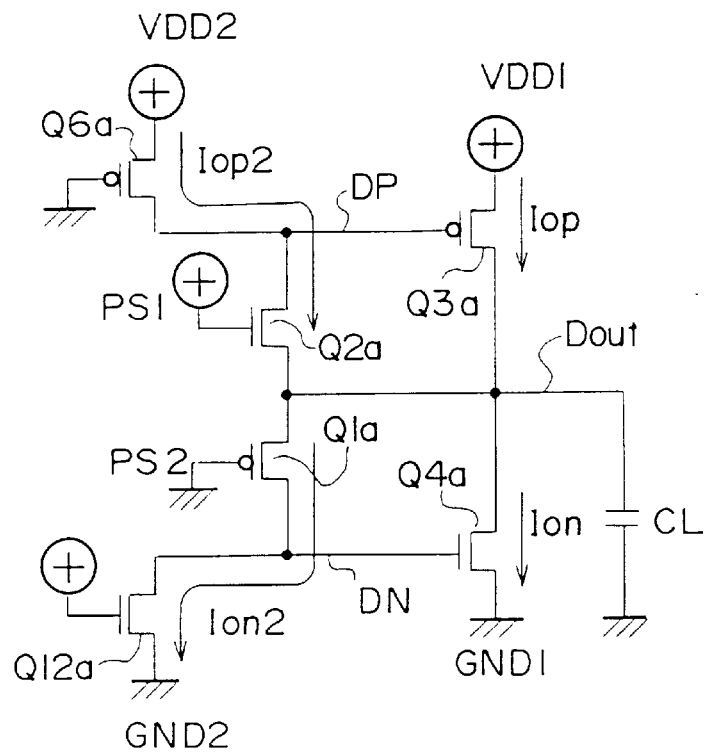
FIG. 23B is a circuit diagram of a portion of the output circuit of FIG. 23A showing the transistors which operate during presetting.
Figure 24A:
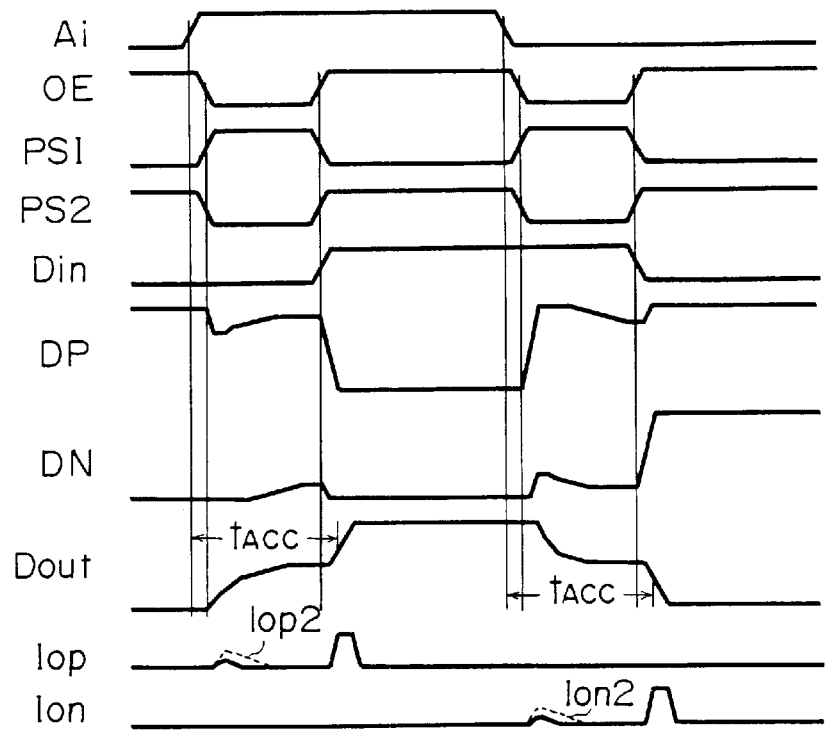
FIG. 24A is an operating waveform diagram of the output circuit of FIG. 23A, in which the output capacitance is a small load capacitance.
Figure 24B:
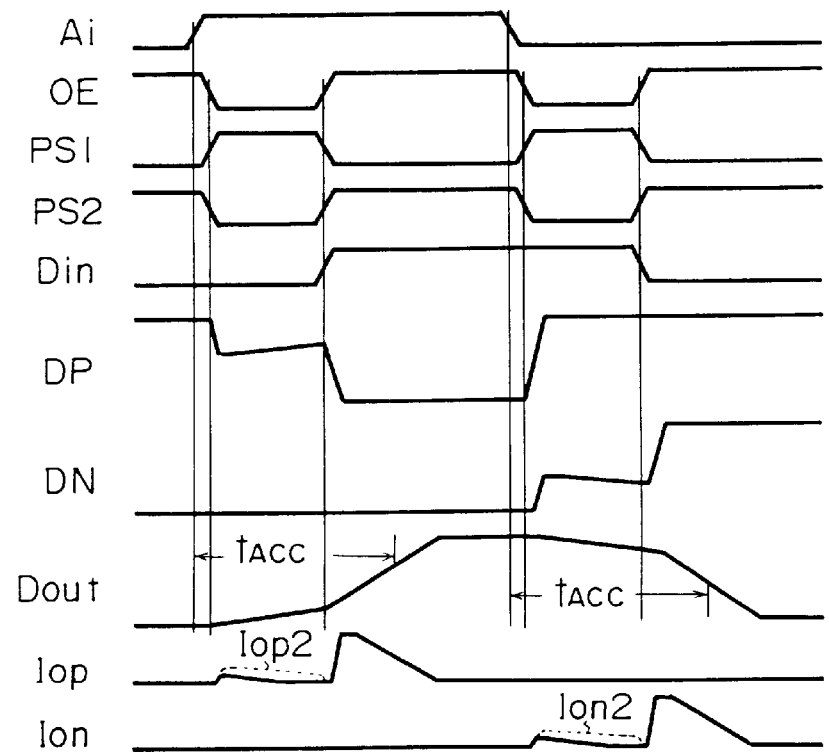
FIG. 24B is an operating waveform diagram of the output circuit of FIG. 23A, in which the output capacitance is a large load capacitance.
Figure 25:
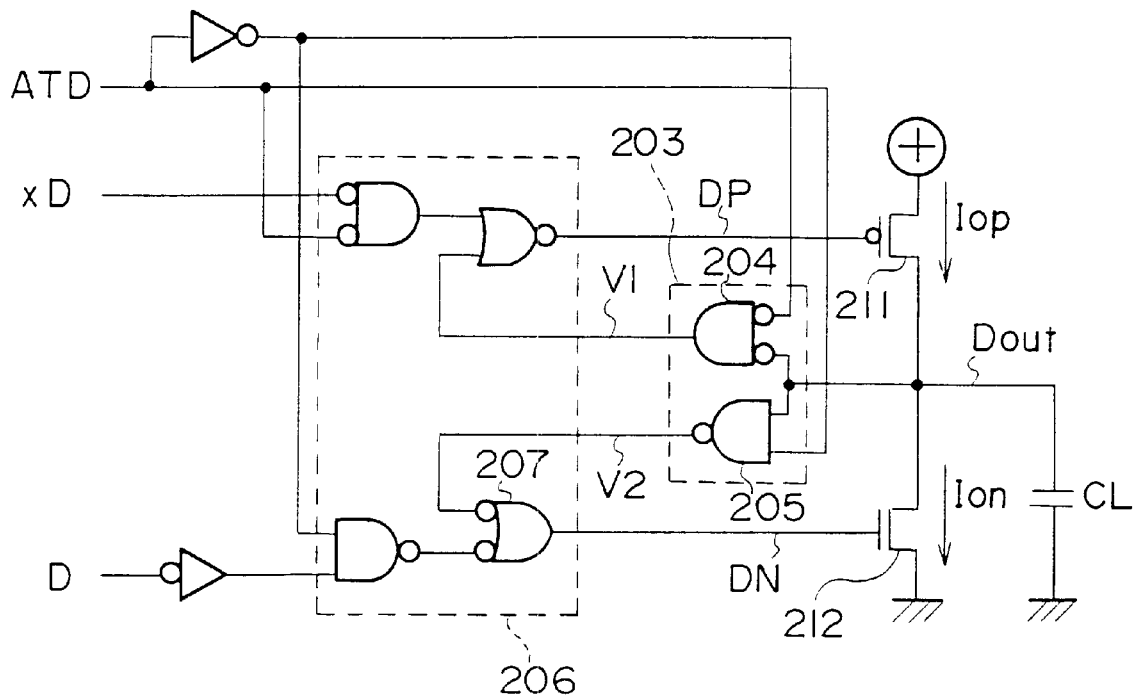
FIG. 25 is a circuit diagram showing the semiconductor device output circuit of prior art 2.
Figure 27:
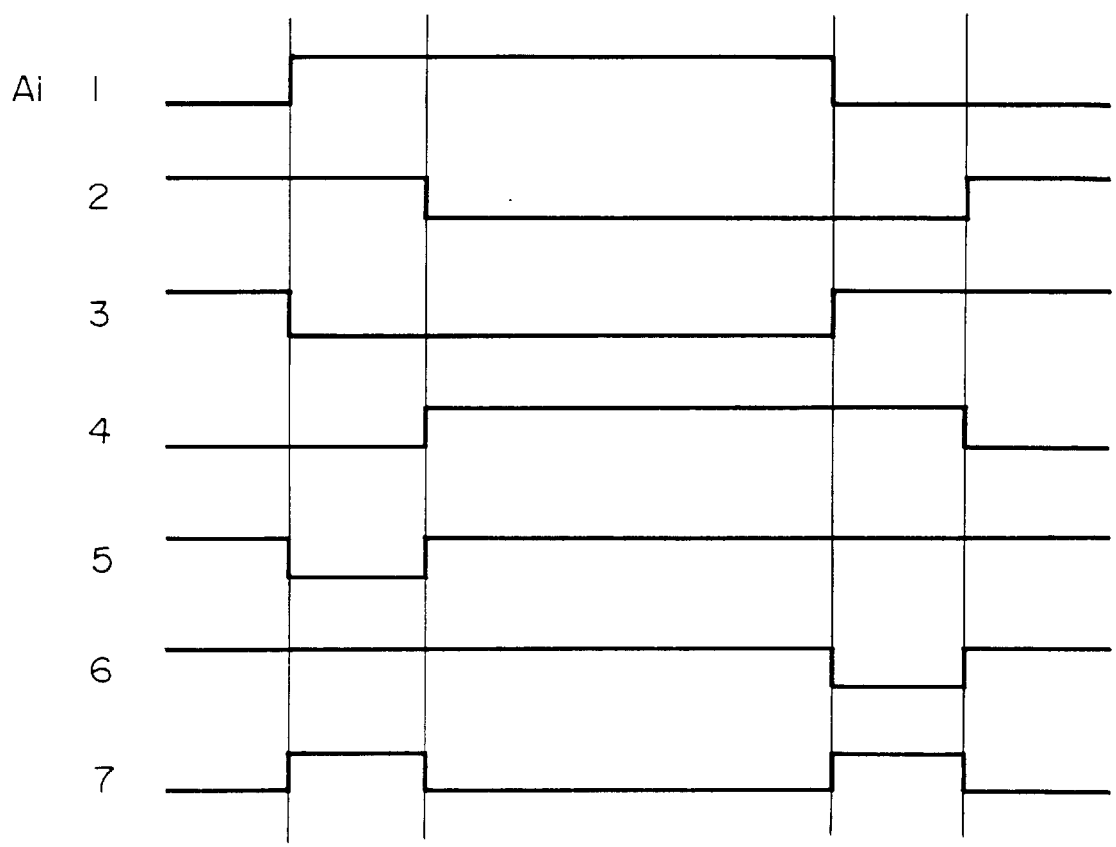
FIG. 27 is an operating waveform diagram showing the operation of an address transition detection circuit of the output circuit of FIG. 21.

Next, a tenth embodiment of the present invention is described with reference to FIGS. 21 and 22. In the tenth embodiment, as the preset control signal PSET of the above embodiments is employed the logic of a transition detection circuit (ATD) 100 which is the internal clock signal of an asynchronous memory device, for example. Therefore, the effect and benefit is the same as in the above-mentioned embodiments. It should be noted that the operating waveforms of the address transition detection circuit are as shown in FIG. 27.

In this embodiment, at the beginning of presetting, the amount of change of the current of the preset transistor or the output drive means (di/dt: the larger this value the larger the voltage effect of the parasitic inductance, and the larger the noise.) is affected by the power of the switch connected between the output terminal and the output preset transistor or output drive means gate terminal, and can easily be adjusted by the size of the switch means.

At this time, since the adjustment can be made separately from the speed of the drive path of the output drive means from the internal data, without sacrificing the drive speed of the output drive means, the amount of change of the current, in other words the noise, at the start of presetting can be adjusted.

It should be noted that the device and method of the present invention have been described above in terms of a number of specific embodiments, but the present invention is not limited to these, and a number of variations will be clear to those skilled in the relevant art without going outside the scope of the present invention. For example, in the above-mentioned embodiments the preset control signal PSET may employ an external clock signal of a synchronous semiconductor device, or may employ a signal which detects changes in an external clock signal.

Figure 26A:
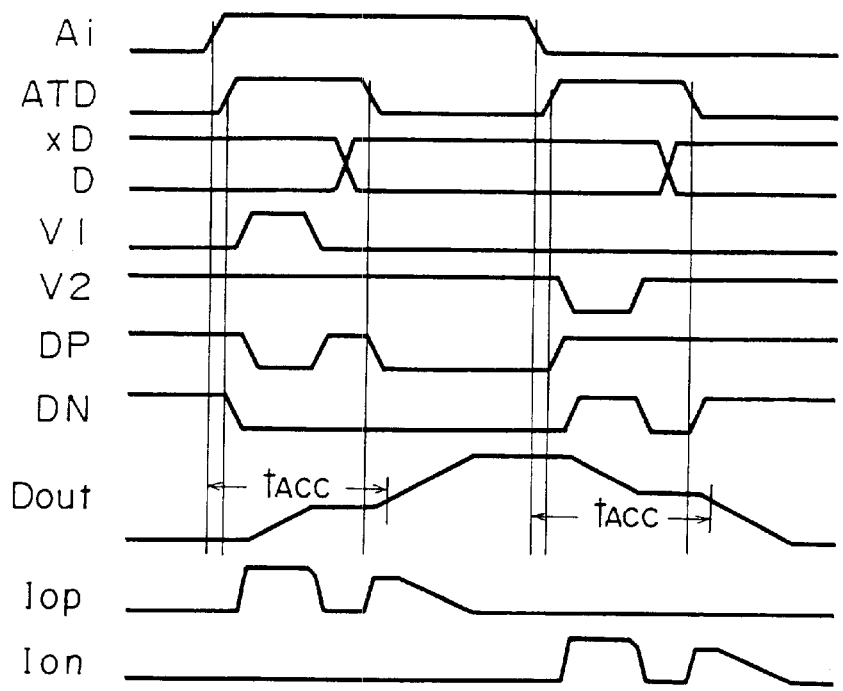
FIG. 26A is an operating waveform diagram of the output circuit of FIG. 25, in which the output capacitance is a large load capacitance.
Figure 26B:
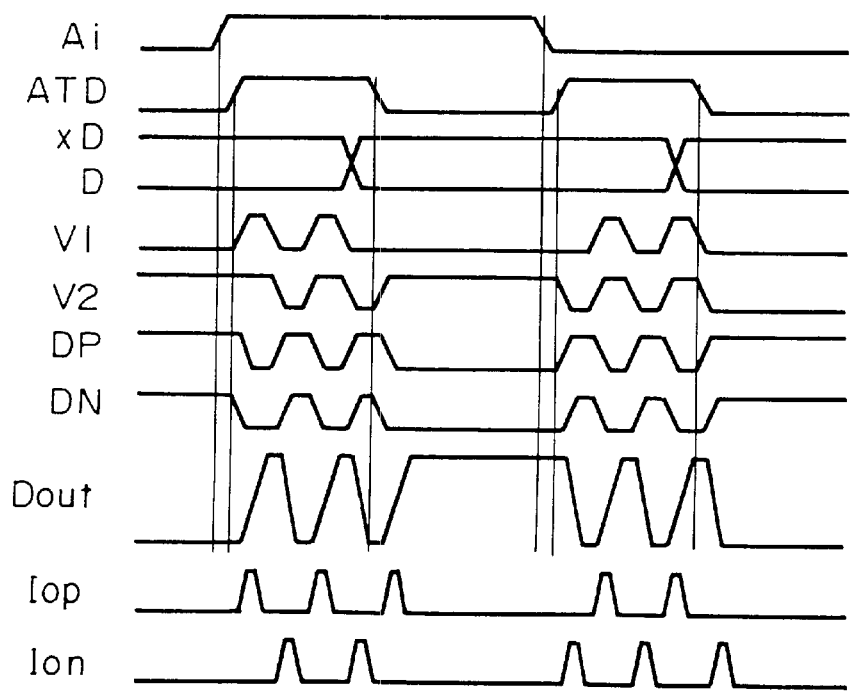
FIG. 26B is an operating waveform diagram of the output circuit of FIG. 25, in which the output capacitance is a small load capacitance.

Again, in the operating waveforms of the embodiments of the present invention shown in FIGS. 3, 11, 16, and 20, the timing of the internal data signals D and xD is different from that in a conventional device, as shown in FIG. 26, but during the presetting operation when the preset control signal PSET goes high, for example, an address transition detection signal ATD may be used to easily control the operation of a sense amplifier.

Again, the output circuit of the present invention can be used regardless of the size of the load capacitance, and in particular from a system with $C_L=30$ pF or thereabouts such as a simple portable telephone or the like to a personal computer, PC board, or the like with $C_L=50$ to 100 pF or thereabouts, as a result of which its general-purpose applicability is enhanced.

Additionally, if the power supply voltage is made high, fast access and low noise operation are possible, so that the range of usable power supply voltage is substantially increased compared with the conventional case, and use as an output circuit of wide applicability, for example to a gate array, random logic output circuit, microprocessor, control IC, or electronic instrument, is possible.

Further, when fixed to an electronic circuit board, the emission of noise from the output circuit itself can be reduced, and therefore, for example, in a semiconductor memory device including the output circuit, the causing by noise emission of erroneous operation of other ICs or other components mounted on the same board is avoided.

Again, as the elements forming the switches, output drive means, and the like, in place of MOS transistors may equally be used bipolar transistors.

Further, in the fourth embodiment, the output drive means may equally by of an open-drain type, and as 31 in FIG. 10 may equally be used an Nch transistor.

Equally, configuration as an electronic instrument including the above-mentioned output circuit is possible. By this means, an electronic instrument of low power consumption can be achieved, and moreover noise and so forth can be positively reduced, and erroneous operation and so forth of other components within the electronic instrument can be prevented.

We claim:

1. An output circuit comprising:
   output drive circuitry including a first transistor which is connected to a power supply line and an output terminal and has a first control terminal to which is input a first control signal, and a second transistor which is connected to a ground line and said output terminal and has a second control terminal to which is input a second control signal, and based on said first and second control signals outputting a data signal from said output terminal;
   at least one output preset transistor connected to at least one of said power supply line and said ground line and to said output terminal, and setting said output terminal to a potential intermediate between the power supply line potential and the ground line potential;
   setting circuitry which, before said data signal is output, controls said first and second control signals to set said first and second transistors to the off state; and
   shorting circuitry which, after setting by said setting circuitry, according to the potential state of said output terminal shorts a preset control terminal of said output preset transistor and said output terminal.

2. The output circuit of claim 1, wherein said shorting circuitry comprises:
   switch circuitry connected between said output terminal and said preset control terminal of said output preset transistor; and
   output potential detection circuitry which detects the potential of said output terminal, and based on the detected output potential controls said switch circuitry; and
   wherein before said data signal is output, said output potential detection circuitry makes said switch circuitry conducting according to said output terminal potential, and operates said output preset transistor to set said output terminal to a predetermined potential.

3. The output circuit of claim 2, wherein said output preset transistor comprises:
   a first preset transistor, connected to said output terminal and said power supply line, and having a third control terminal; and
   a second preset transistor, of opposite conductivity type to said first preset transistor, connected to said output terminal and said ground line, and having a fourth control terminal; and
   wherein said switch circuitry comprises:
      first switch circuitry connected between said third control terminal of said first preset transistor and said output terminal; and
      second switch circuitry connected between said fourth control terminal of said second preset transistor and said output terminal.

4. The output circuit of claim 1,
   wherein a presetting operation of setting said output terminal to a predetermined potential intermediate between the power supply line potential and the ground line potential is controlled based on a pulse signal generated by detecting a transition in address signals.

5. An output circuit for outputting a data signal after setting an output terminal to a potential intermediate between a power supply line potential and a ground line potential, comprising:

potential setting circuitry connected to said output terminal for lowering the output terminal voltage to set said output terminal to said intermediate potential; and wherein said potential setting circuitry has current-voltage characteristics such that as an input voltage thereto falls, a current flowing in said potential setting circuitry falls, said rate of falling of the current with said fall in the input voltage is smaller later than initially, and when the input voltage is close to a threshold voltage of said potential setting circuitry, the current is small.

6. The output circuit of claim 5, wherein said potential setting circuitry includes:

at least one output preset transistor, connected to at least one of said power supply line and said ground line, and said output terminal, and setting said output terminal to a predetermined potential intermediate between the power supply line potential and the ground line potential.

7. The output circuit of claim 5, wherein a presetting operation of setting said output terminal to a predetermined potential intermediate between the power supply line potential and the ground line potential is controlled based on a pulse signal generated by detecting a transition in address signals.

8. An output circuit for outputting a data signal after setting an output terminal to a potential intermediate between a power supply line potential and a ground line potential, comprising:

potential setting circuitry connected to said output terminal for lowering the output terminal voltage to set said output terminal to said intermediate potential;

wherein said potential setting circuitry has current-voltage characteristics such that as an input voltage thereto falls, a current flowing in said potential setting circuitry falls, a rate of falling of the current with said fall in the input voltage is smaller later than initially, and when the input voltage is close to a threshold voltage of said potential setting circuitry, the current is small; and wherein said potential setting circuitry comprises:

output drive circuitry including a first transistor connected to the power supply line and said output terminal and having a first control terminal to which is input a first control signal, and a second transistor connected to the ground line and said output terminal and having a second control terminal to which is input a second control signal, and based on said first and second control signals outputting a data signal from said output terminal;

output control circuitry outputting said first and second control signals to said first and second control terminals of said first and second transistors to control said first and second transistors;

switch circuitry connected between one of said first and second control terminals and said output terminal; and output potential detection circuitry detecting the potential of said output terminal, and based on the detected output potential controlling said switch circuitry.

9. An output circuit for outputting a data signal after setting an output terminal to a potential intermediate between a power supply line potential and a ground line potential, comprising:

potential setting circuitry connected to said output terminal for raising the output terminal voltage to set said output terminal to said intermediate potential; and wherein said potential setting circuitry has current-voltage characteristics such that as an input voltage thereto rises, a current flowing in said potential setting circuitry falls, said rate of falling of the current with said rise in the input voltage is smaller later than initially, and when the input voltage is close to a threshold voltage of said potential setting circuitry, the current is small.

10. The output circuit of claim 9, wherein said potential setting circuitry includes:

at least one output preset transistor, connected to at least one of said power supply line and said ground line, and said output terminal, and setting said output terminal to a predetermined potential intermediate between the power supply line potential and the ground line potential.

11. The output circuit of claim 9, wherein a presetting operation of setting said output terminal to a predetermined potential intermediate between the power supply line potential and the ground line potential is controlled based on a pulse signal generated by detecting a transition in address signals.

12. An output circuit for outputting a data signal after setting an output terminal to a potential intermediate between a power supply line potential and a ground line potential, comprising:

potential setting circuitry connected to said output terminal for raising the output terminal voltage to set said output terminal to said intermediate potential;

wherein said potential setting circuitry has current-voltage characteristics such that as an input voltage thereto rises, a current flowing in said potential setting circuitry falls, a rate of falling of the current with said rise in the input voltage is smaller later than initially, and when the input voltage is close to a threshold voltage of said potential setting circuitry, the current is small; and wherein said potential setting circuitry comprises:

output drive circuitry including a first transistor connected to the power supply line and said output terminal and having a first control terminal to which is input a first control signal, and a second transistor connected to the ground line and said output terminal and having a second control terminal to which is input a second control signal, and based on said first and second control signals outputting a data signal from said output terminal;

output control circuitry outputting said first and second control signals to said first and second control terminals of said first and second transistors to control said first and second transistors;

switch circuitry connected between one of said first and second control terminals and said output terminal; and output potential detection circuitry detecting the potential of said output terminal, and based on the detected output potential controlling said switch circuitry.

13. An electronic instrument comprising an output circuit, the output circuit comprising:

output drive circuitry including a first transistor which is connected to a power supply line and an output terminal and has a first control terminal to which is input a first control signal, and a second transistor which is connected to a ground line and said output terminal and has a second control terminal to which is input a second control signal, and based on said first and second control signals outputting a data signal from said output terminal;

at least one output preset transistor connected to at least one of said power supply line and said ground line and to said output terminal, and setting said output terminal to a potential intermediate between the power supply line potential and the ground line potential;

setting circuitry which, before said data signal is output, controls said first and second control signals to set said first and second transistors to the off state; and shorting circuitry which, after setting by said setting circuitry, according to the potential state of said output terminal shorts a preset control terminal of said output preset transistor and said output terminal.

14. An electronic instrument comprising an output circuit, the output circuit comprising:

output drive circuitry including a first transistor which is connected to a power supply line and an output terminal and has a first control terminal to which is input a first control signal, and a second transistor which is connected to a ground line and said output terminal and has a second control terminal to which is input a second control signal, and based on said first and second control signals outputting a data signal from said output terminal;

setting circuitry which, before said data signal is output, controls said first and second control signals to set said first and second transistors to the off state; and shorting circuitry which, after setting by said setting circuitry, according to the potential state of said output terminal shorts one of said first and second control terminals and said output terminal.

15. An electronic instrument comprising an output circuit for outputting a data signal after setting an output terminal to a potential intermediate between a power supply line potential and a ground line potential, the output circuit comprising:

potential setting circuitry connected to said output terminal, and lowering the output terminal voltage to set said output terminal to said intermediate potential, wherein said potential setting circuitry has current-voltage characteristics such that as an input voltage thereto falls, a current flowing in said potential setting circuitry falls, said rate of falling of the current with said fall in the input voltage is smaller later than initially, and when the input voltage is close to a threshold voltage of said potential setting circuitry, the current is small.

16. An electronic instrument comprising an output circuit for outputting a data signal after setting an output terminal to a potential intermediate between a power supply line potential and a ground line potential, the output circuitry comprising:

potential setting circuitry connected to said output terminal, and raising the output terminal voltage to set said output terminal to said intermediate potential, wherein said potential setting circuitry has current-voltage characteristics such that as an input voltage thereto rises, a current flowing in said potential setting circuitry falls, said rate of falling of the current with said rise in the input voltage is smaller later than initially, and when the input voltage is close to a threshold voltage of said potential setting circuitry, the current is small.

17. An output circuit comprising:

output drive circuitry including a first transistor which is connected to a power supply line and an output terminal and has a first control terminal to which is input a first control signal, and a second transistor which is connected to a ground line and said output terminal and has a second control terminal to which is input a second control signal, and based on said first and second control signals outputting a data signal from said output terminal;

setting circuitry which, before said data signal is output, controls said first and second control signals to set said first and second transistors to the off state;

shorting circuitry which, after setting by said setting circuitry, according to the potential state of said output terminal shorts one of said first and second control terminals and said output terminal;

wherein said shorting circuitry comprises:
first switch circuitry connected between at least one of said first and second control terminals and said output terminal;

output potential detection circuitry which detects the potential of said output terminal, and based on the detected output potential controls said first switch circuitry;

wherein said setting circuitry comprises:
output control circuitry which outputs said first and second control signals to said first and second control terminals of said first and second transistors to control said first and second transistors;

second switch circuitry connected between said at least one of said first and second control terminals to which said first switch circuitry is connected and said output control means, and controlled by said output potential detection circuitry; and wherein before said data signal is output, said output potential detection circuitry controls said first and second switch circuitry connected to the same one of said first and second control terminals, sets said second switch circuitry in the non-conducting state to inhibit the output of said data signal, and sets said first switch circuitry in the conducting state, whereby one of said first and second transistors connected to said same one terminal is operated to set said output terminal to a predetermined potential intermediate between the power supply line potential and the ground line potential.

18. The output circuit of claim 17,
wherein said second switch circuitry is a transmission gate which sets said output control circuitry and at least one of said first and second control terminals to be selectively one of conducting and non-conducting in accordance with a detected potential by said output potential detection circuitry.

19. The output circuit of claim 17, wherein said second switch circuitry is formed of a first conductivity type transistor and a second conductivity type transistor; and wherein said output control circuitry comprises:
a third transistor connected to said power supply line and to said first conductivity type transistor; and
a fourth transistor connected to said ground line and to said second conductivity type transistor.

20. The output circuit of claim 17, wherein said first switch circuitry comprises a first switch connected between said output terminal and said first control terminal of said first transistor, and a second switch connected between said output terminal and said second control terminal of said second transistor;

wherein said second switch circuitry comprises a third switch connected between said first control terminal of said first transistor and said output control circuitry, and a fourth switch connected between said second control terminal of said second transistor and said output control circuitry; and wherein before said data signal is output, said output potential detection circuitry makes one of said first and second switch circuitry conducting; and wherein said output control circuitry operates one of said first and second transistors to set said output terminal to a predetermined potential intermediate between the power supply line potential and the ground line potential.

21. The output circuit of claim 20, wherein each of said first transistor and said second switch is formed by a transistor of a first conductivity type;

wherein each of said second transistor and said first switch is formed by a transistor of a second conductivity type; and wherein each of said third switch and said fourth switch is formed by a transistor of said first conductivity type and a transistor of said second conductivity type.

22. The output circuit of claim 9, wherein each of said first transistor, said second switch, and said third switch is formed by a transistor of a first conductivity type; and wherein each of said second transistor, said first switch, and said fourth switch is formed by a transistor of a second conductivity type.

23. The output circuit of claim 17, wherein a presetting operation of setting said output terminal to a predetermined potential intermediate between the power supply line potential and the ground line potential is controlled based on a pulse signal generated by detecting a transition in address signals.

* * * * *